United States Patent
Nonoguchi et al.

(10) Patent No.: US 10,186,658 B2
(45) Date of Patent: Jan. 22, 2019

(54) MEMORY DEVICE AND METHOD OF MANUFACTURING MEMORY DEVICE

(71) Applicant: Sony Semiconductor Solutions Corporation, Kanagawa (JP)

(72) Inventors: Seiji Nonoguchi, Kanagawa (JP); Takeyuki Sone, Kanagawa (JP); Minoru Ikarashi, Kanagawa (JP); Hiroaki Narisawa, Tokyo (JP); Katsuhisa Aratani, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 0 days.

(21) Appl. No.: 14/650,448

(22) PCT Filed: Nov. 21, 2013

(86) PCT No.: PCT/JP2013/081380
§ 371 (c)(1),
(2) Date: Jun. 8, 2015

(87) PCT Pub. No.: WO2014/103577
PCT Pub. Date: Jul. 3, 2014

(65) Prior Publication Data
US 2015/0325628 A1  Nov. 12, 2015

(30) Foreign Application Priority Data
Dec. 26, 2012 (JP) ................. 2012-282108

(51) Int. Cl.
*H01L 45/00* (2006.01)
*H01L 27/24* (2006.01)
(Continued)

(52) U.S. Cl.
CPC .............. *H01L 45/122* (2013.01); *G11C 5/02* (2013.01); *G11C 5/025* (2013.01);
(Continued)

(58) Field of Classification Search
CPC ......... H01L 45/00; H01L 45/04; H01L 45/06; H01L 45/08; H01L 45/085; H01L 45/14;
(Continued)

(56) References Cited

U.S. PATENT DOCUMENTS

| 8,486,791 B2* | 7/2013 | Lue ..................... H01L 21/8221 257/324 |
| 2004/0125629 A1* | 7/2004 | Scheuerlein ....... G11C 16/0483 365/17 |

(Continued)

FOREIGN PATENT DOCUMENTS

| CN | 101889312 A | 11/2010 |
| CN | 102473707 A | 5/2012 |

(Continued)

OTHER PUBLICATIONS

International Search Report; International Application No. PCT/JP2013/081380; Date of mailing of the International Search Reprt: dated Feb. 10 , 2014.

(Continued)

*Primary Examiner* — Eduardo A Rodela
(74) *Attorney, Agent, or Firm* — Michael Best & Friedrich LLP

(57) ABSTRACT

Provided is a storage apparatus provided with a plurality of storage elements having storage layers comprising a plurality of layers and electrodes, one layer among the plurality of layers being extended in a first direction and being shared by the plurality of storage elements disposed in the first direction, the electrodes being extended in a second direction that differs from the first direction and being shared by the plurality of storage elements disposed in the second direction.

19 Claims, 36 Drawing Sheets

(51) Int. Cl.
*G11C 5/02* (2006.01)
*G11C 13/00* (2006.01)

(52) U.S. Cl.
CPC ........ *G11C 13/0002* (2013.01); *H01L 27/249* (2013.01); *H01L 27/2427* (2013.01); *H01L 27/2463* (2013.01); *H01L 27/2481* (2013.01); *H01L 45/00* (2013.01); *H01L 45/04* (2013.01); *H01L 45/08* (2013.01); *H01L 45/085* (2013.01); *H01L 45/1226* (2013.01); *H01L 45/1266* (2013.01); *H01L 45/145* (2013.01); *H01L 45/146* (2013.01); *H01L 45/147* (2013.01); *H01L 45/1675* (2013.01); *H01L 45/1683* (2013.01); *G11C 2213/52* (2013.01); *G11C 2213/71* (2013.01)

(58) Field of Classification Search
CPC ... H01L 45/141; H01L 45/145; H01L 45/065; H01L 45/10; H01L 45/12; H01L 45/122; H01L 45/1226; H01L 45/1233; H01L 45/1253
See application file for complete search history.

(56) References Cited

U.S. PATENT DOCUMENTS

| | | | | |
|---|---|---|---|---|
| 2006/0226411 | A1* | 10/2006 | Lee | G11C 11/56 257/2 |
| 2007/0158736 | A1* | 7/2007 | Arai | H01L 27/105 257/315 |
| 2010/0148143 | A1* | 6/2010 | Fujii | H01L 27/101 257/5 |
| 2010/0254178 | A1 | 10/2010 | Tsushima et al. | |
| 2011/0002155 | A1 | 1/2011 | Arita et al. | |
| 2011/0140068 | A1* | 6/2011 | Ozawa | H01L 27/249 257/4 |
| 2011/0182103 | A1* | 7/2011 | Smythe | H01L 45/145 365/148 |
| 2011/0194329 | A1* | 8/2011 | Ohba | G11C 13/0011 365/148 |
| 2011/0278531 | A1 | 11/2011 | Erbetta et al. | |
| 2011/0286283 | A1* | 11/2011 | Lung | G11C 16/0483 365/185.28 |
| 2012/0091422 | A1* | 4/2012 | Choi | H01L 27/2409 257/4 |
| 2012/0104351 | A1* | 5/2012 | Wei | H01L 27/2409 257/4 |
| 2012/0145987 | A1* | 6/2012 | Sei | H01L 45/08 257/5 |
| 2012/0181654 | A1* | 7/2012 | Lue | H01L 21/8221 257/506 |
| 2012/0182103 | A1* | 7/2012 | Miyabara | H01F 41/026 335/302 |
| 2013/0288391 | A1* | 10/2013 | Lee | H01L 45/16 438/3 |
| 2014/0048761 | A1* | 2/2014 | Nojiri | H01L 45/146 257/2 |
| 2014/0077142 | A1* | 3/2014 | Choi | H01L 45/04 257/2 |

FOREIGN PATENT DOCUMENTS

| | | |
|---|---|---|
| JP | 2008-042034 A | 2/2008 |
| JP | 2009-146480 A | 7/2009 |
| JP | 2010-010688 A | 1/2010 |
| JP | 2011-243980 A | 12/2011 |
| JP | 2013-201405 A | 10/2013 |
| WO | WO-2010/004675 A1 | 1/2010 |
| WO | WO-2012/001960 A1 | 1/2012 |

OTHER PUBLICATIONS

Chinese Office Action dated Apr. 17, 2017 for corresponding Chinese Application No. 201380066069.8.

* cited by examiner

[ FIG. 1 ]
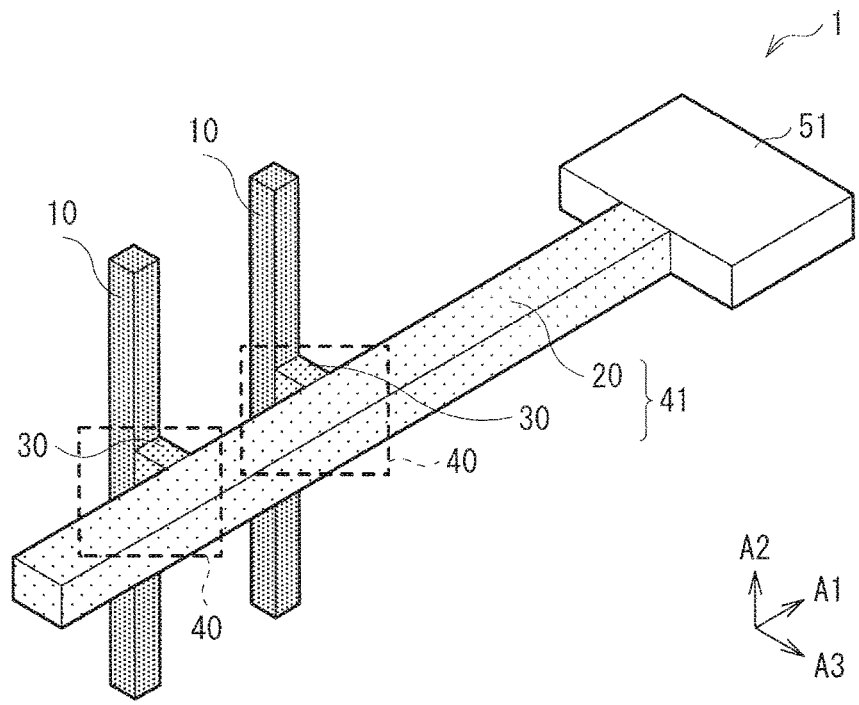
[ FIG. 2 ]
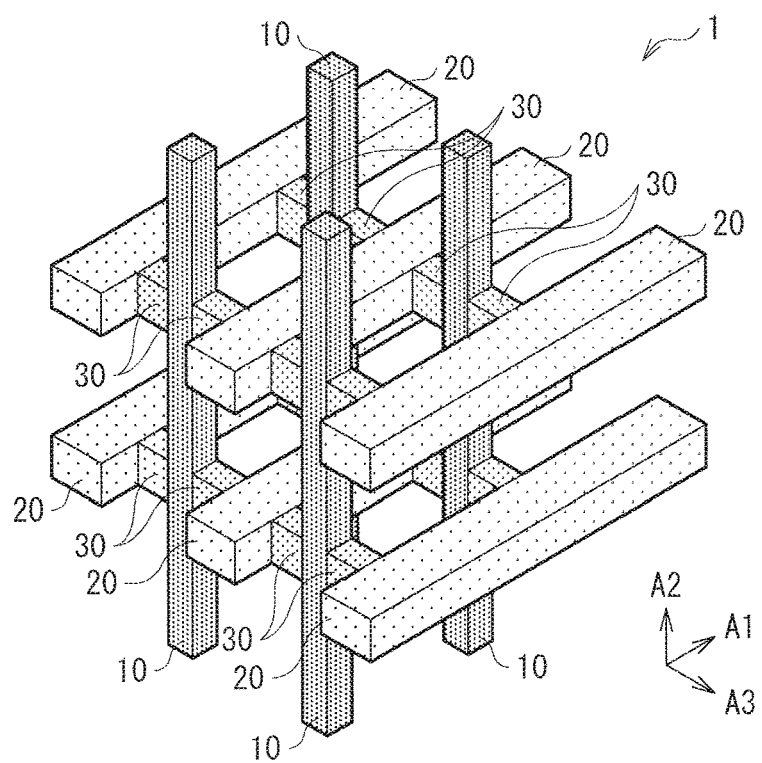

[ FIG. 3 ]
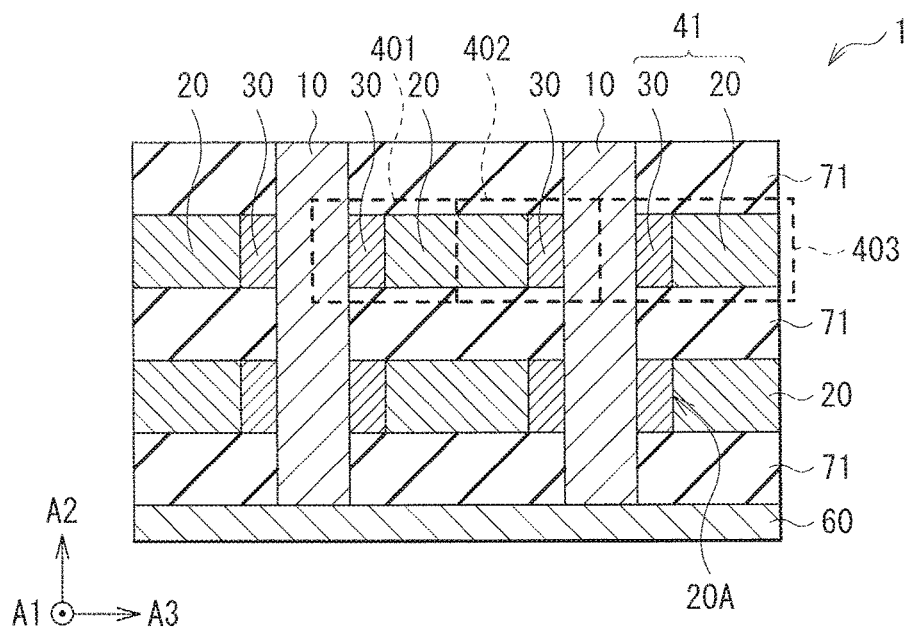
[ FIG. 4 ]
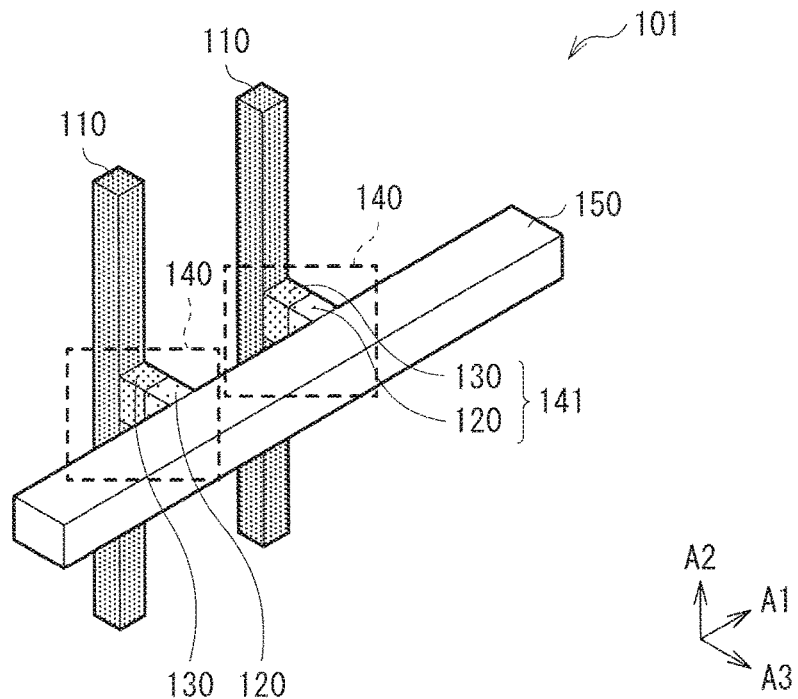

[ FIG. 5 ]
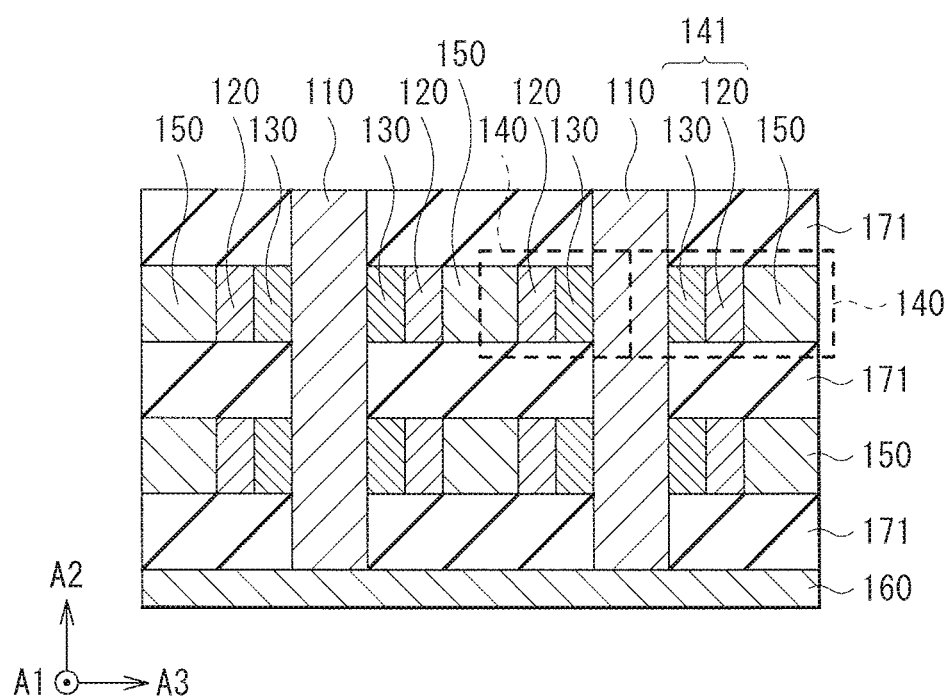

[FIG. 6]
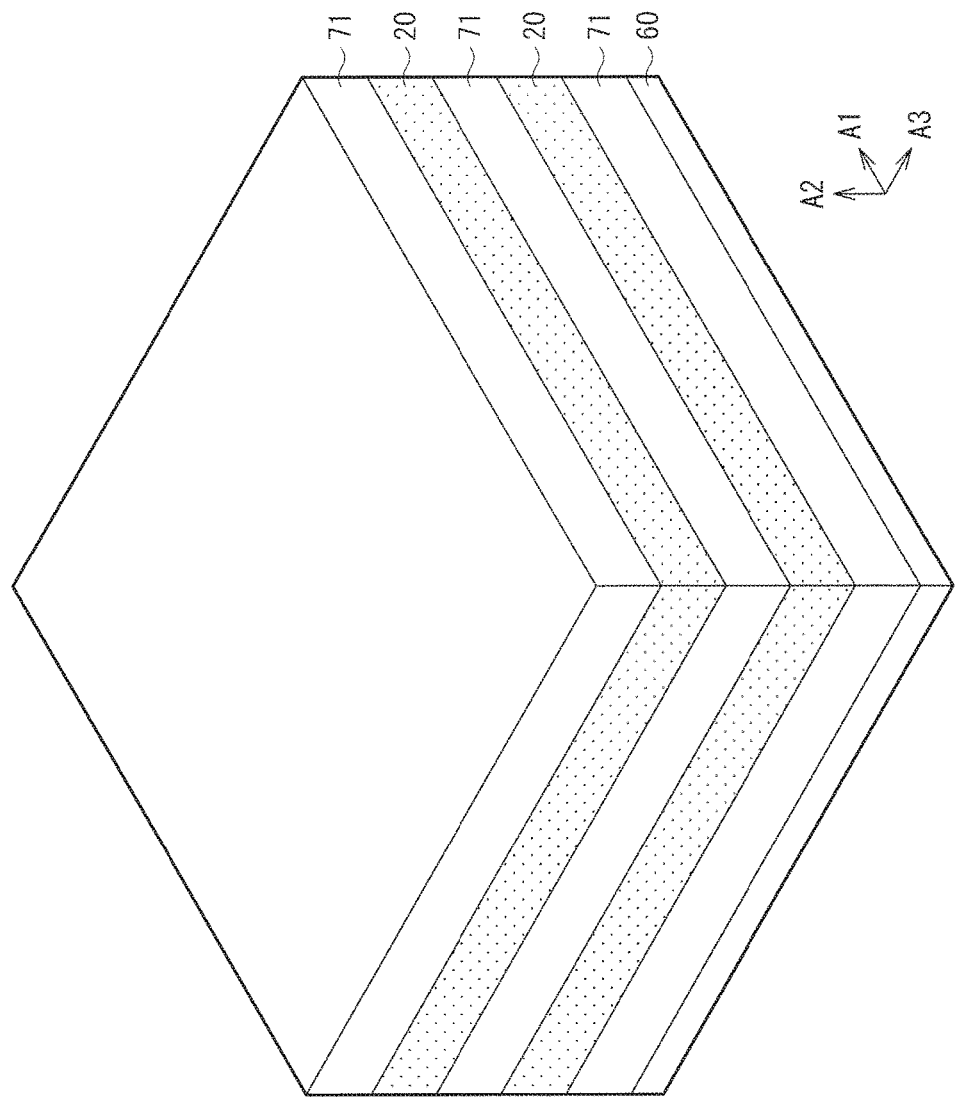

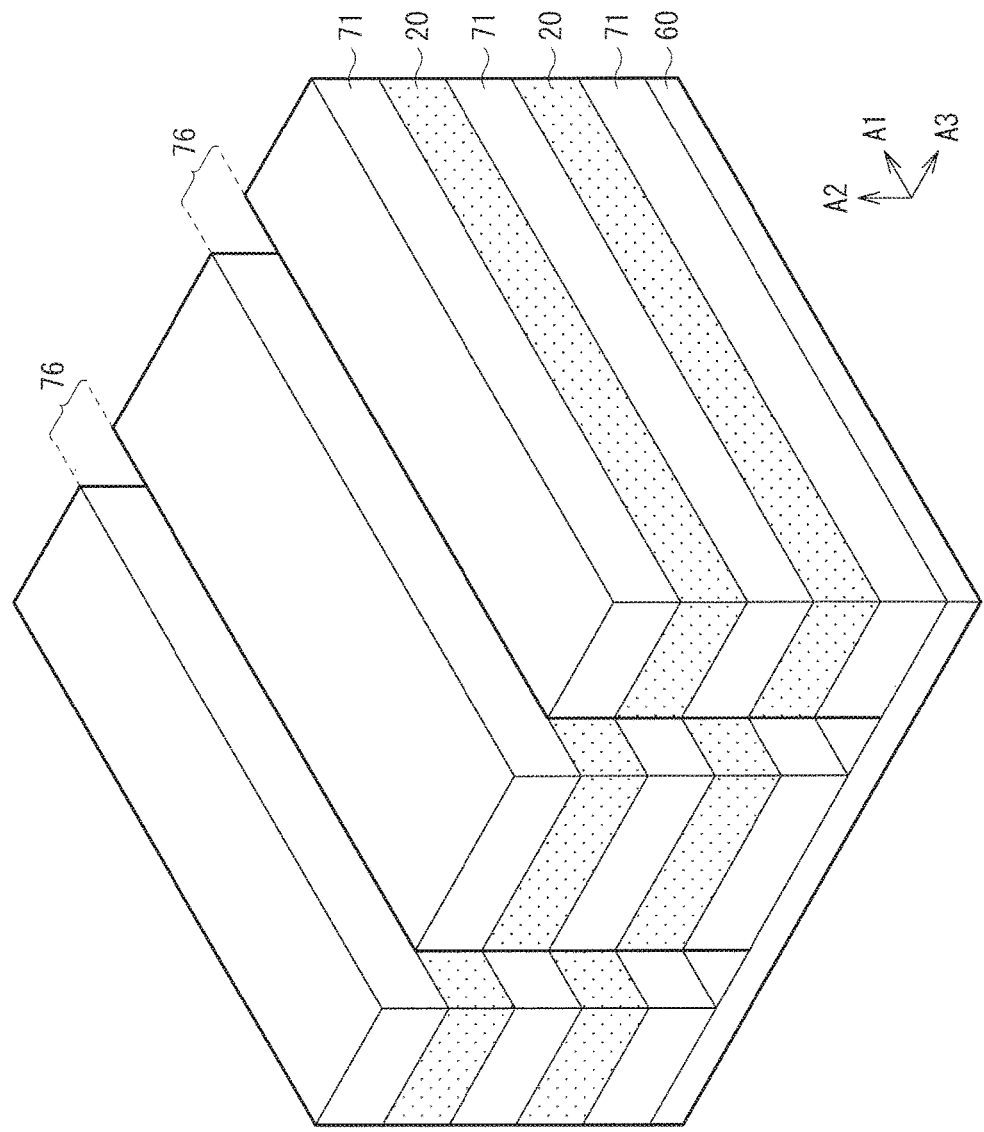
[FIG. 7]

[ FIG. 8 ]
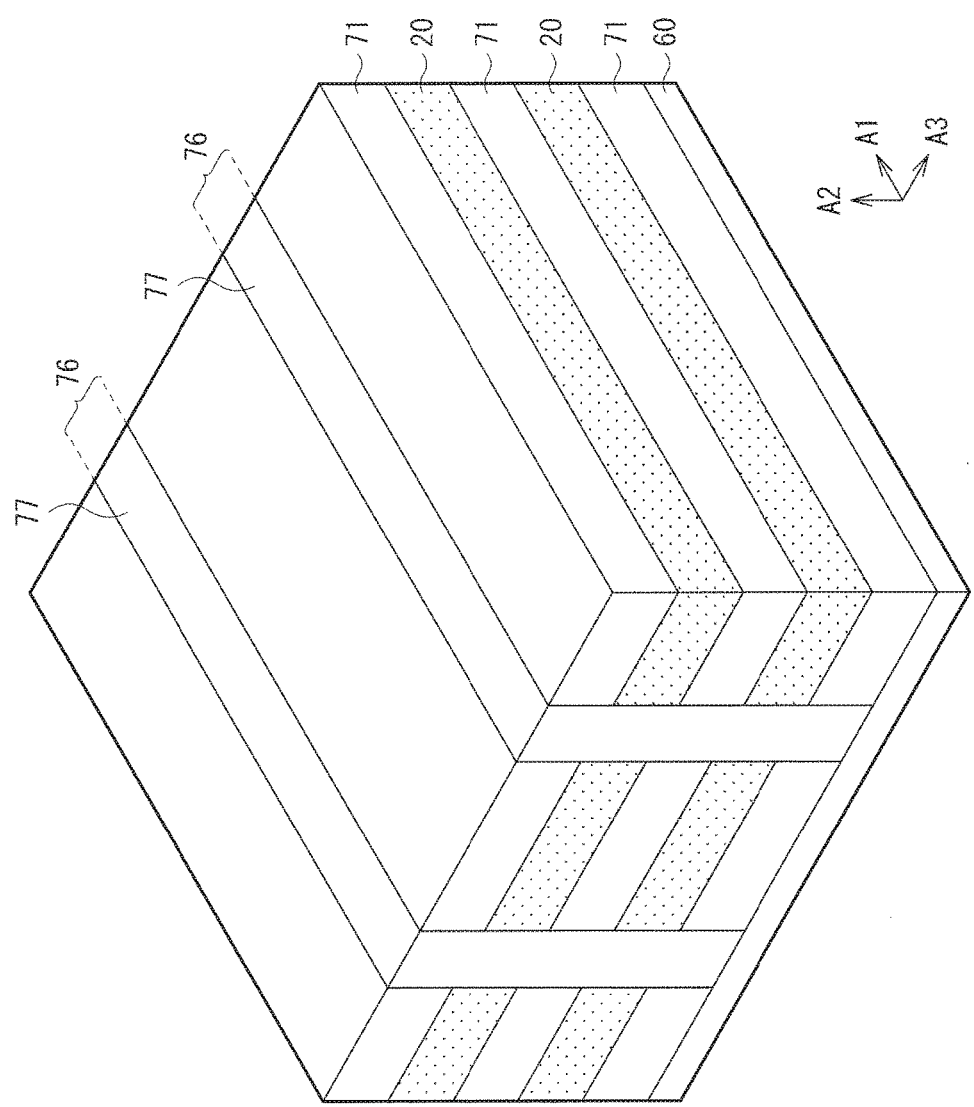

[ FIG. 9 ]
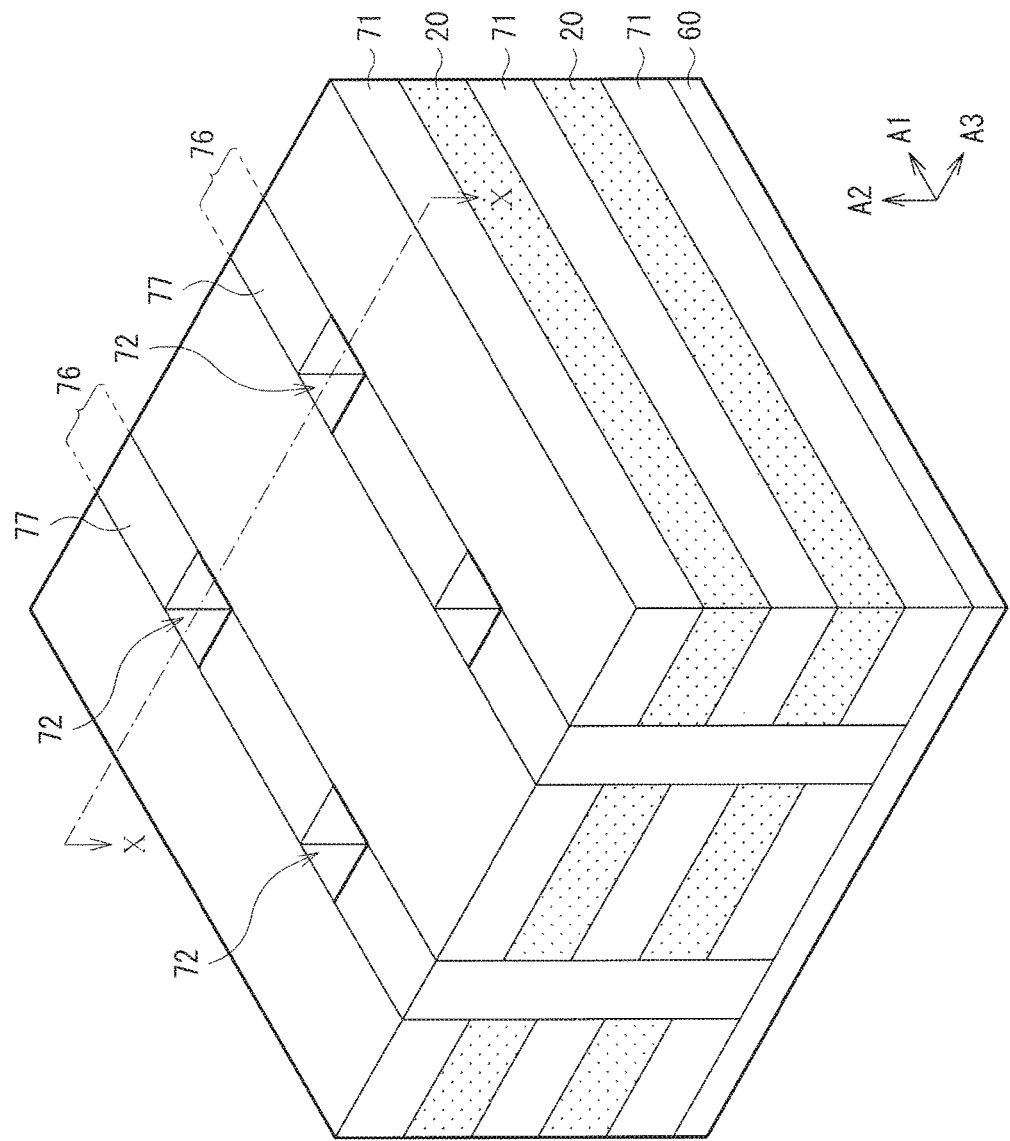

[ FIG. 10 ]
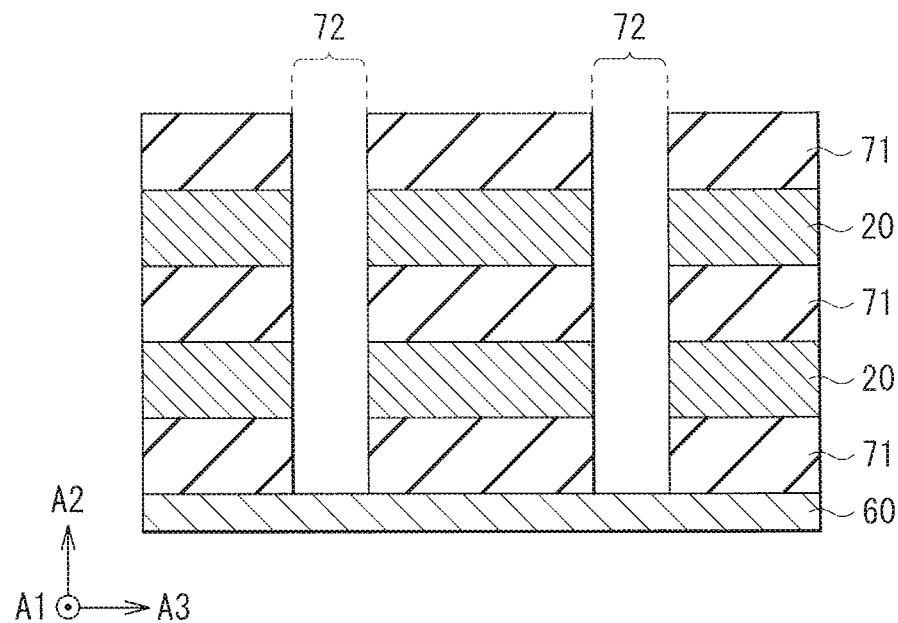
[ FIG. 11 ]
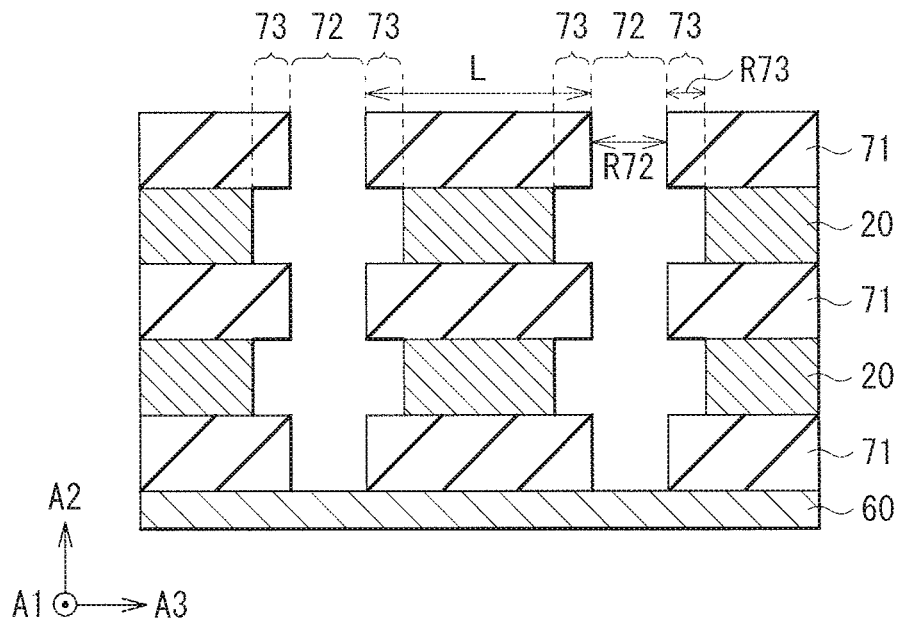

[ FIG. 12 ]
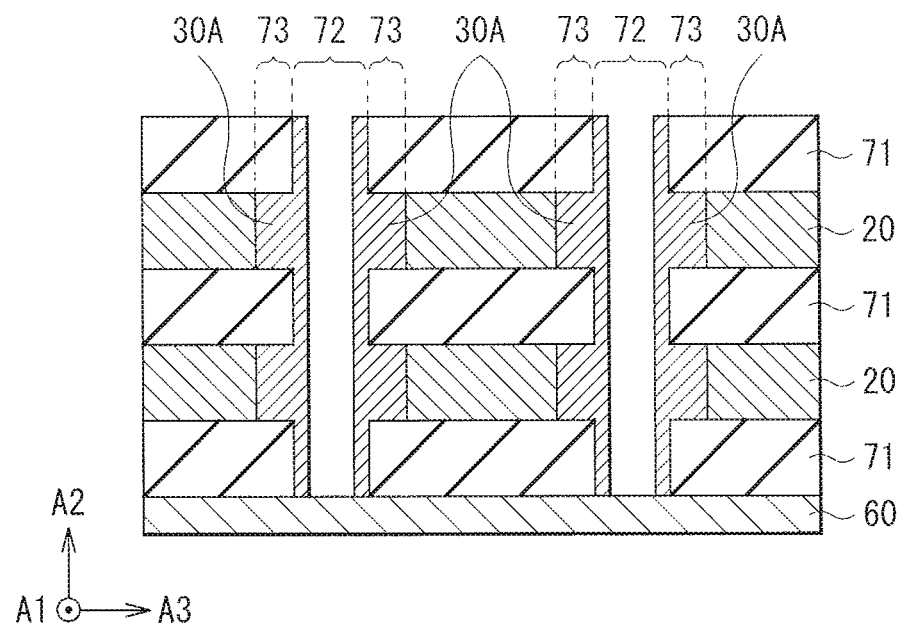
[ FIG. 13 ]
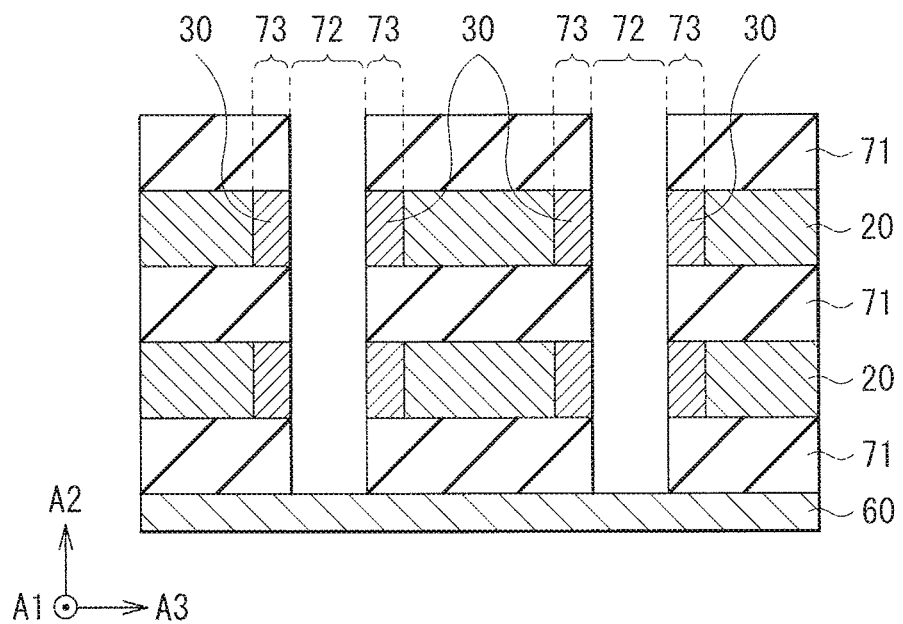

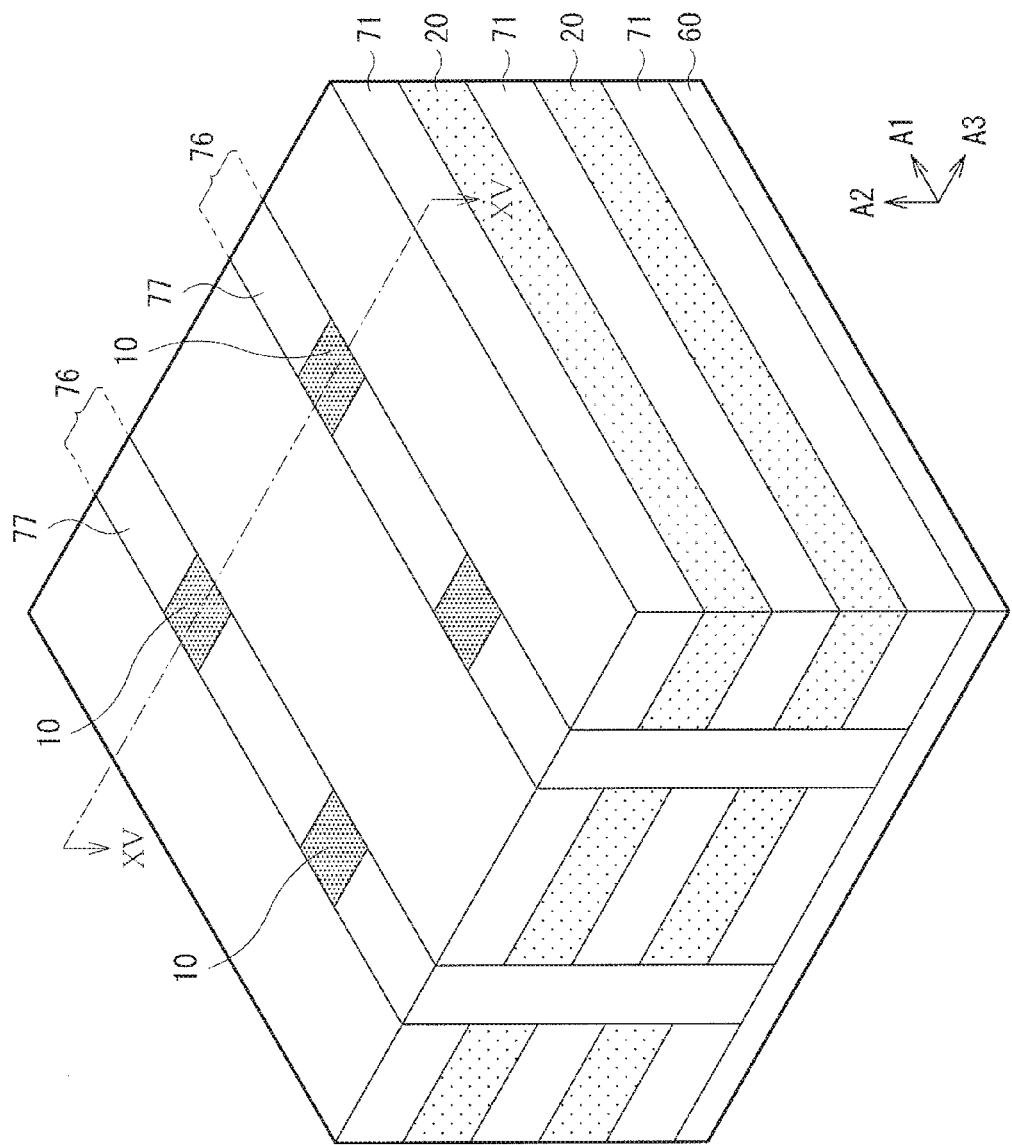
[FIG. 14]

[ FIG. 15 ]
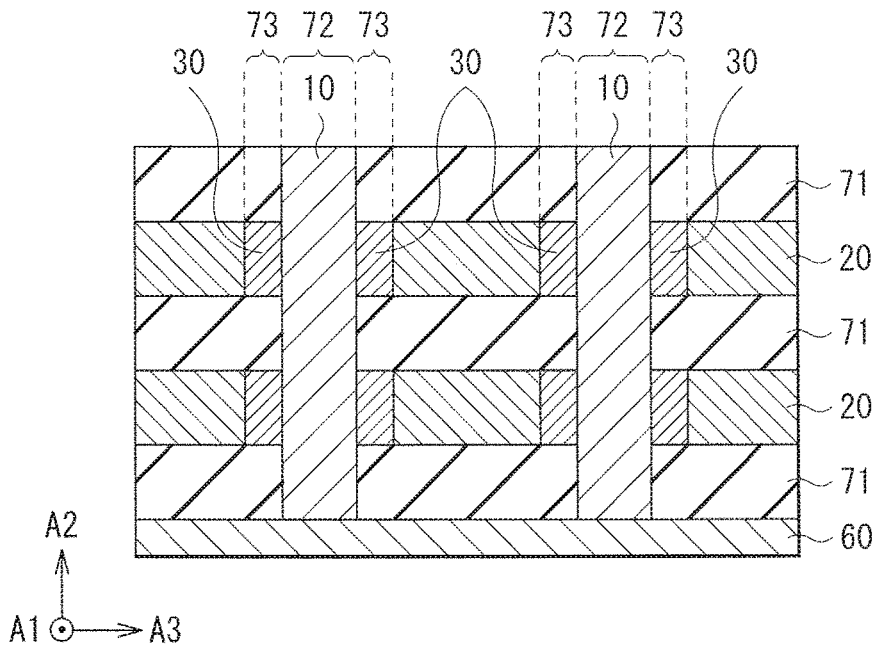
[ FIG. 16 ]
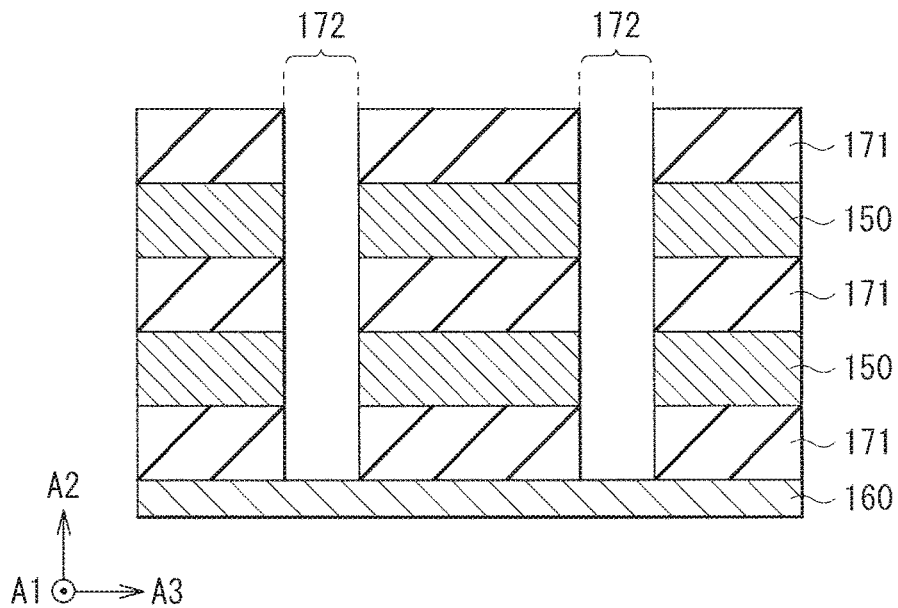

[ FIG. 17 ]
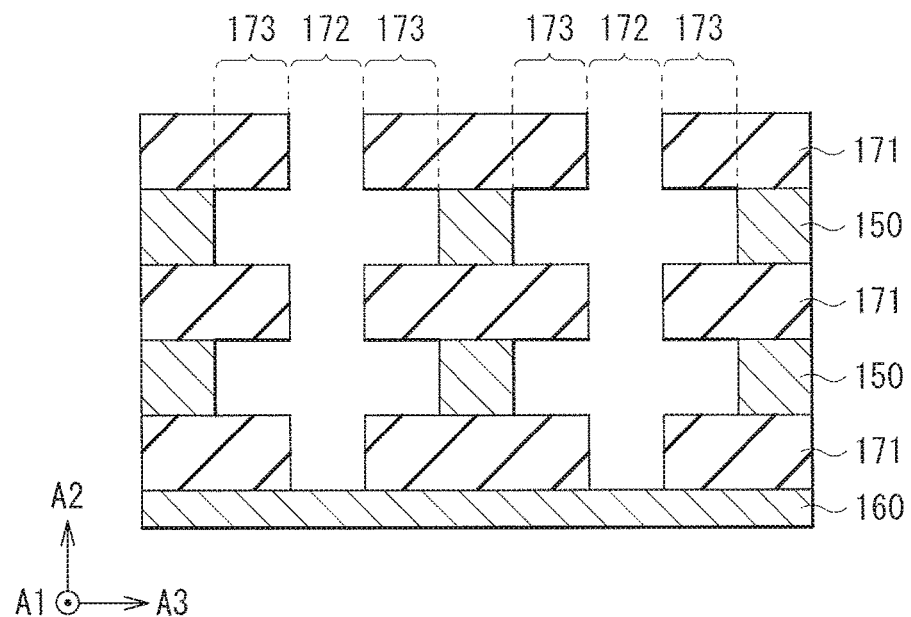
[ FIG. 18 ]
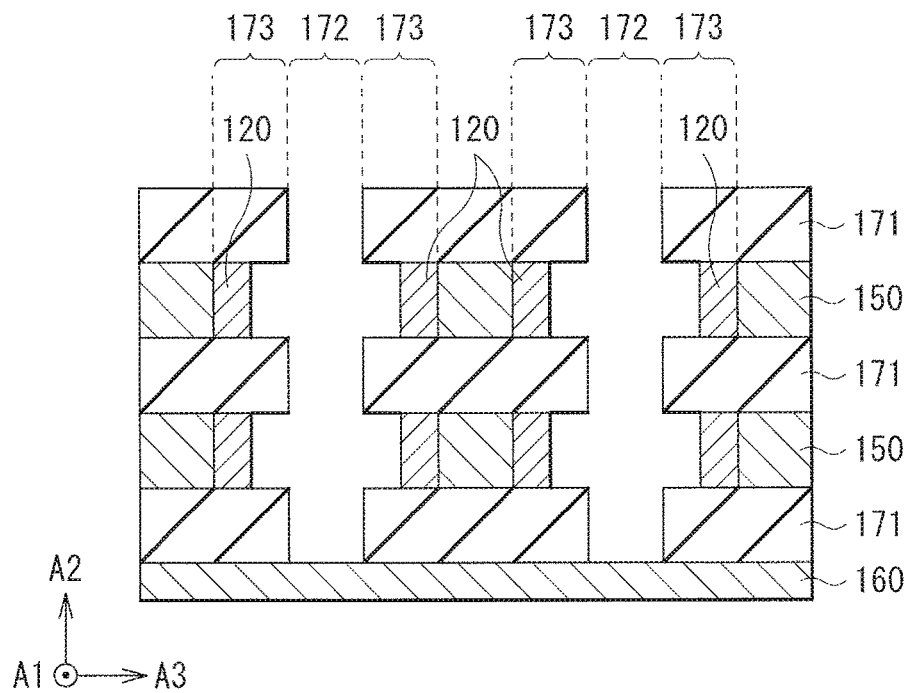

[ FIG. 19 ]
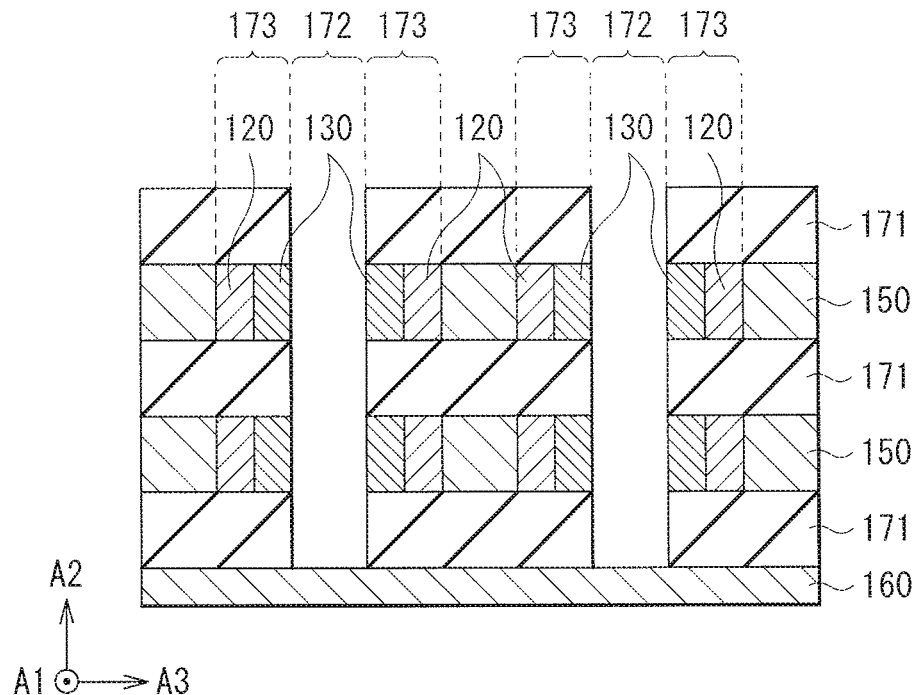
[ FIG. 20 ]
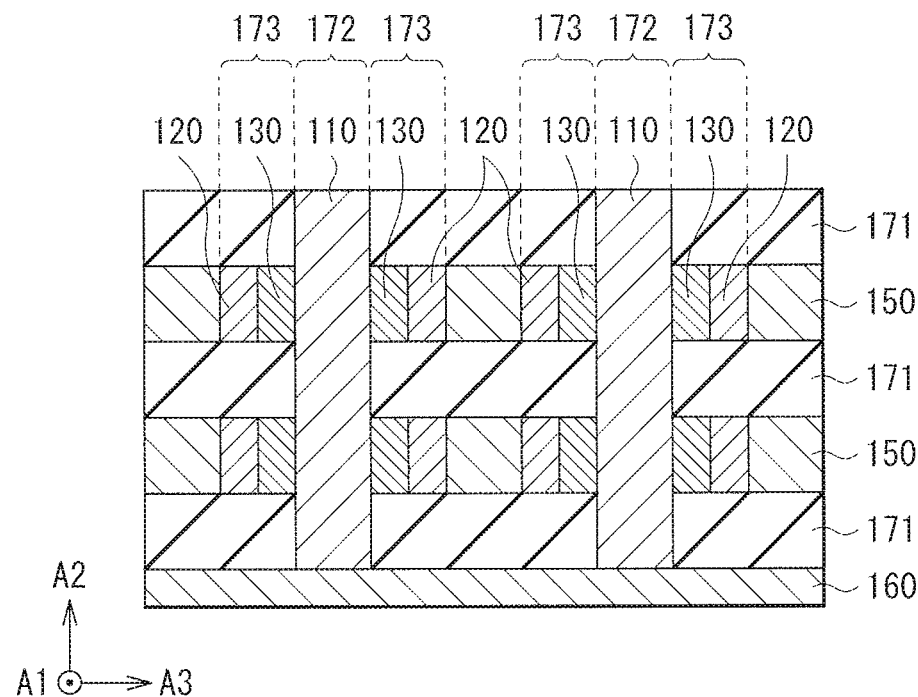

[ FIG. 21 ]
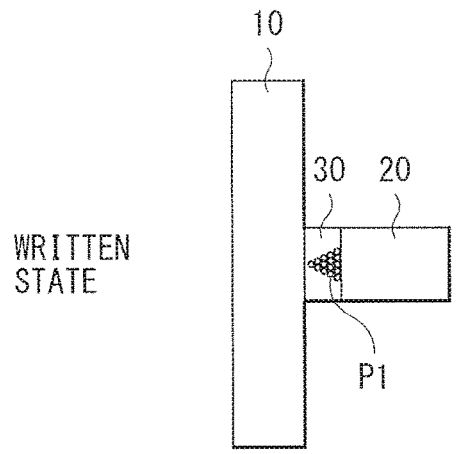
WRITTEN STATE
[ FIG. 22 ]
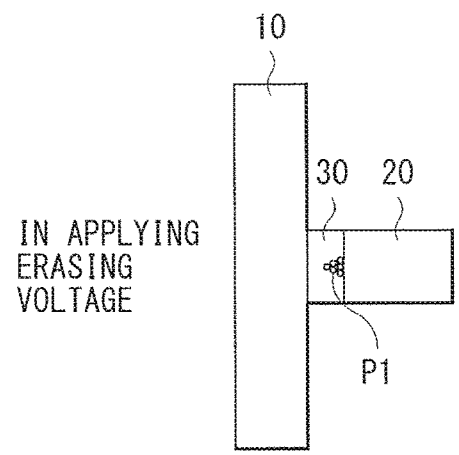
IN APPLYING ERASING VOLTAGE
[ FIG. 23 ]
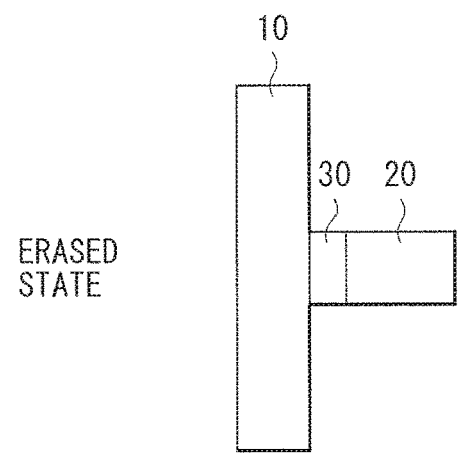
ERASED STATE

[ FIG. 24 ]
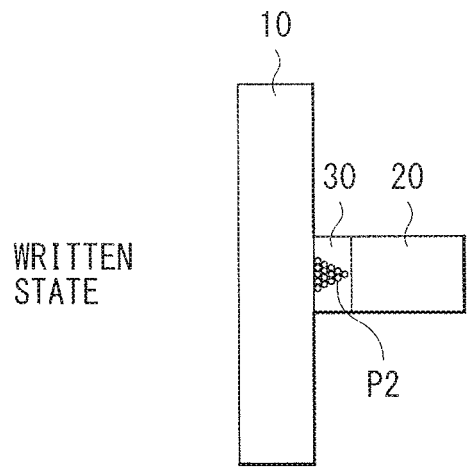
WRITTEN STATE
[ FIG. 25 ]
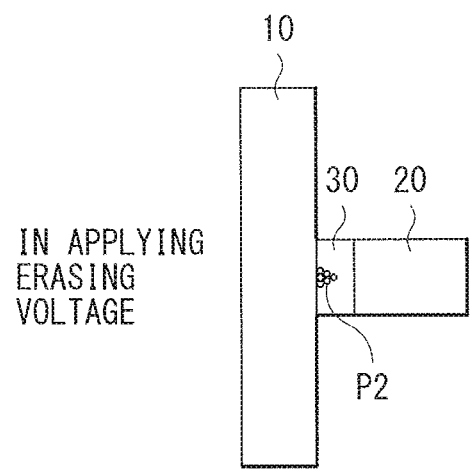
IN APPLYING ERASING VOLTAGE
[ FIG. 26 ]
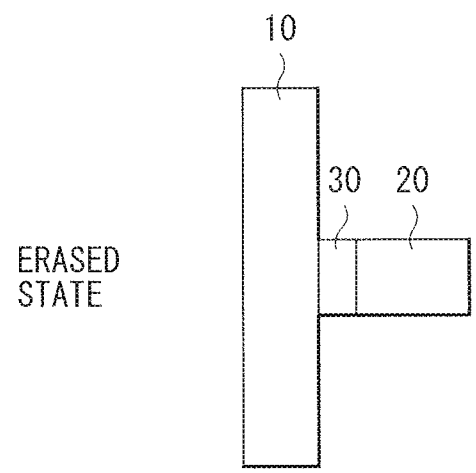
ERASED STATE

[ FIG. 27 ]
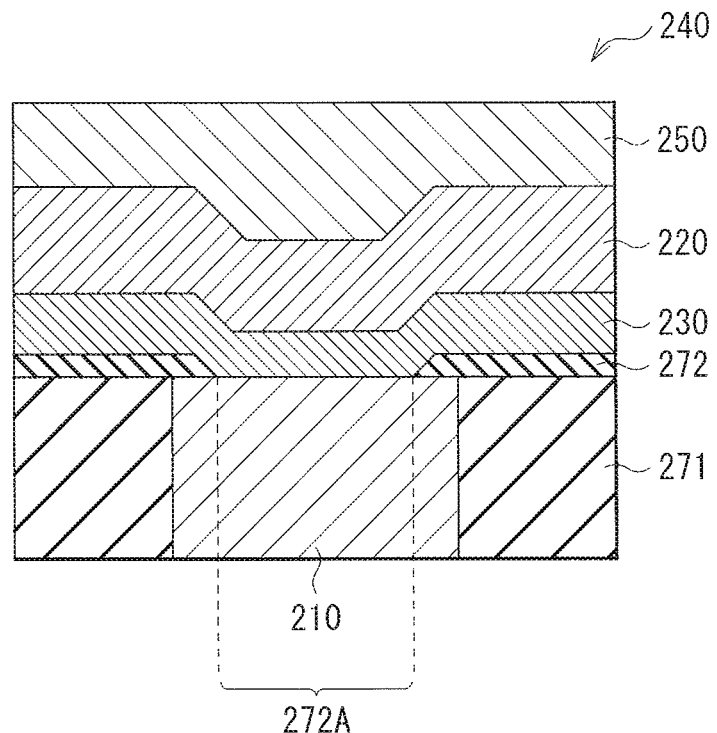
[ FIG. 28 ]
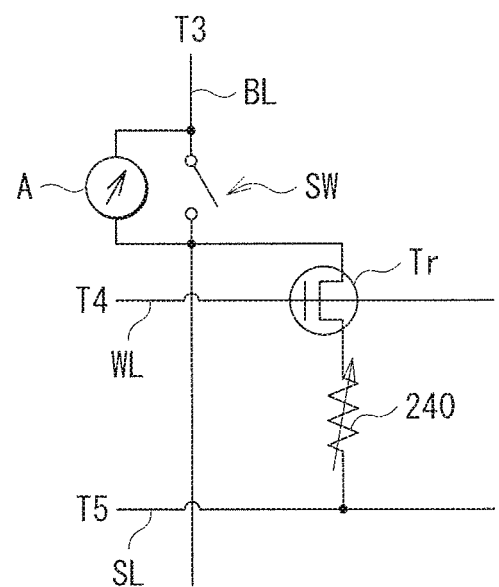

[ FIG. 29 ]
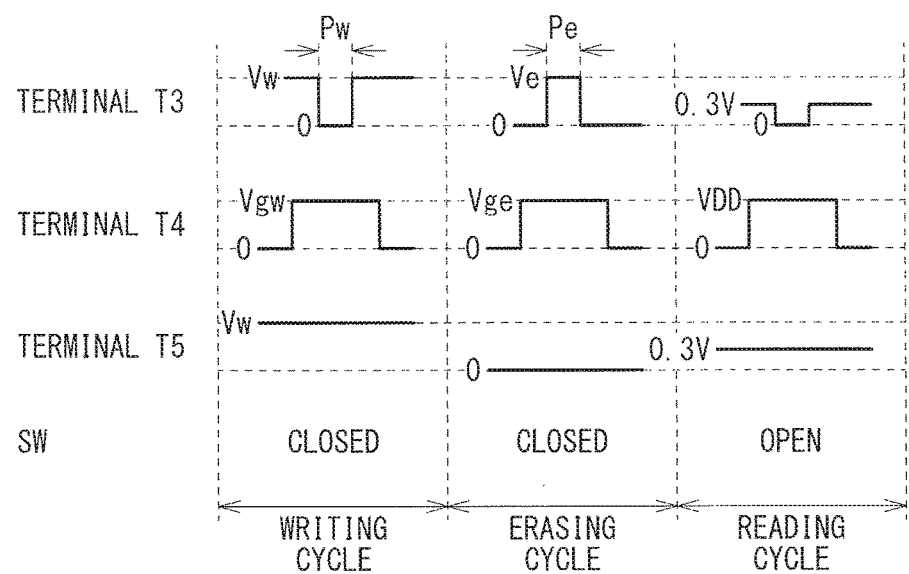
VDD: POWER SUPPLY VOLTAGE
Vw: WRITING VOLTAGE (APPLIED TO MEMORY CELL)
Vgw: GATE VOLTAGE IN WRITING
Pw: PULSE WIDTH OF WRITING VOLTAGE
Ve: ERASING VOLTAGE (APPLIED TO MEMORY CELL)
Vge: GATE VOLTAGE IN ERASING
Pe: PULSE WIDTH OF ERASING VOLTAGE

[FIG. 30]
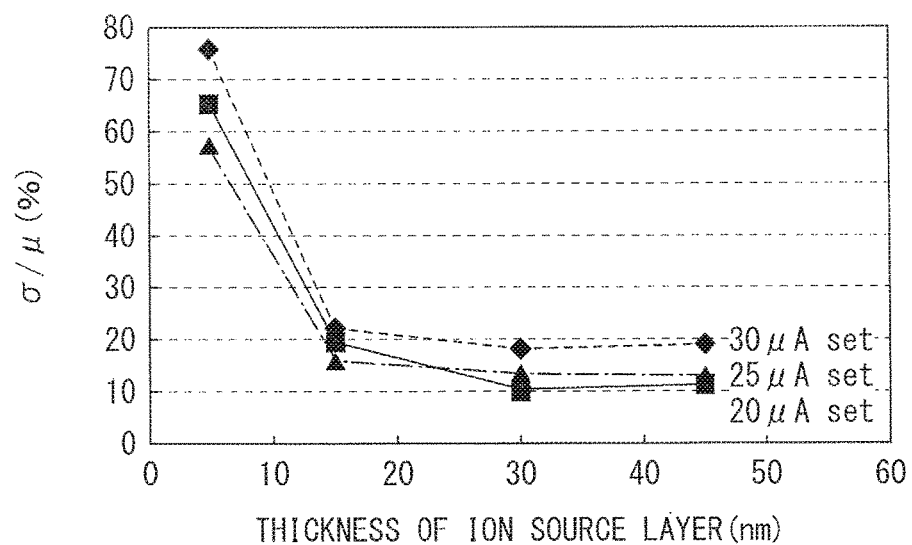
[FIG. 31]
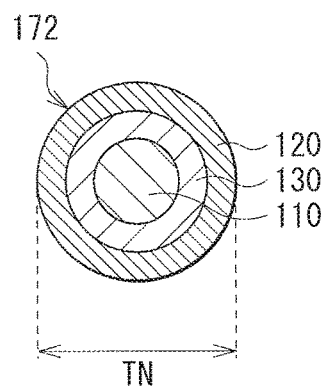

[ FIG. 32 ]
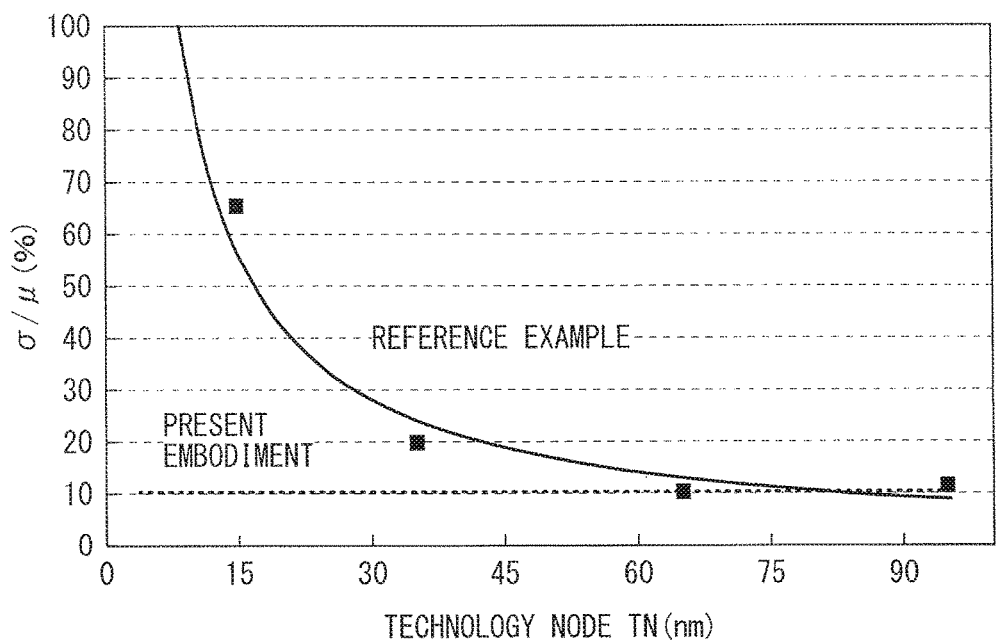
[ FIG. 33 ]
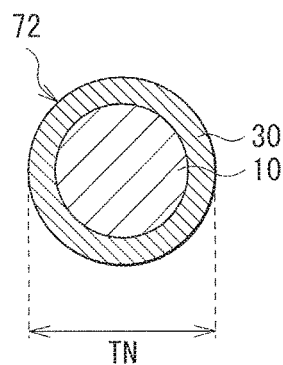

[FIG. 34]
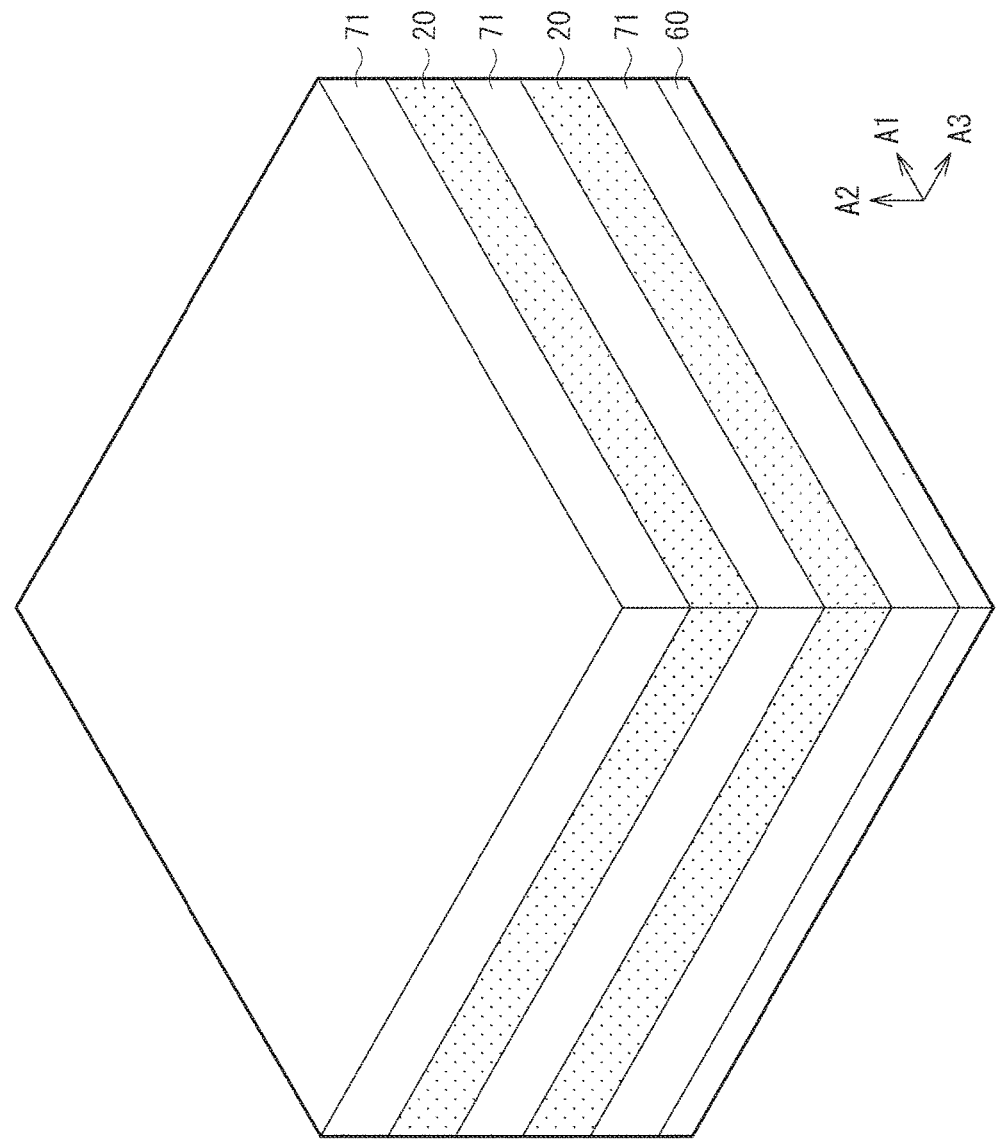

[FIG. 35]
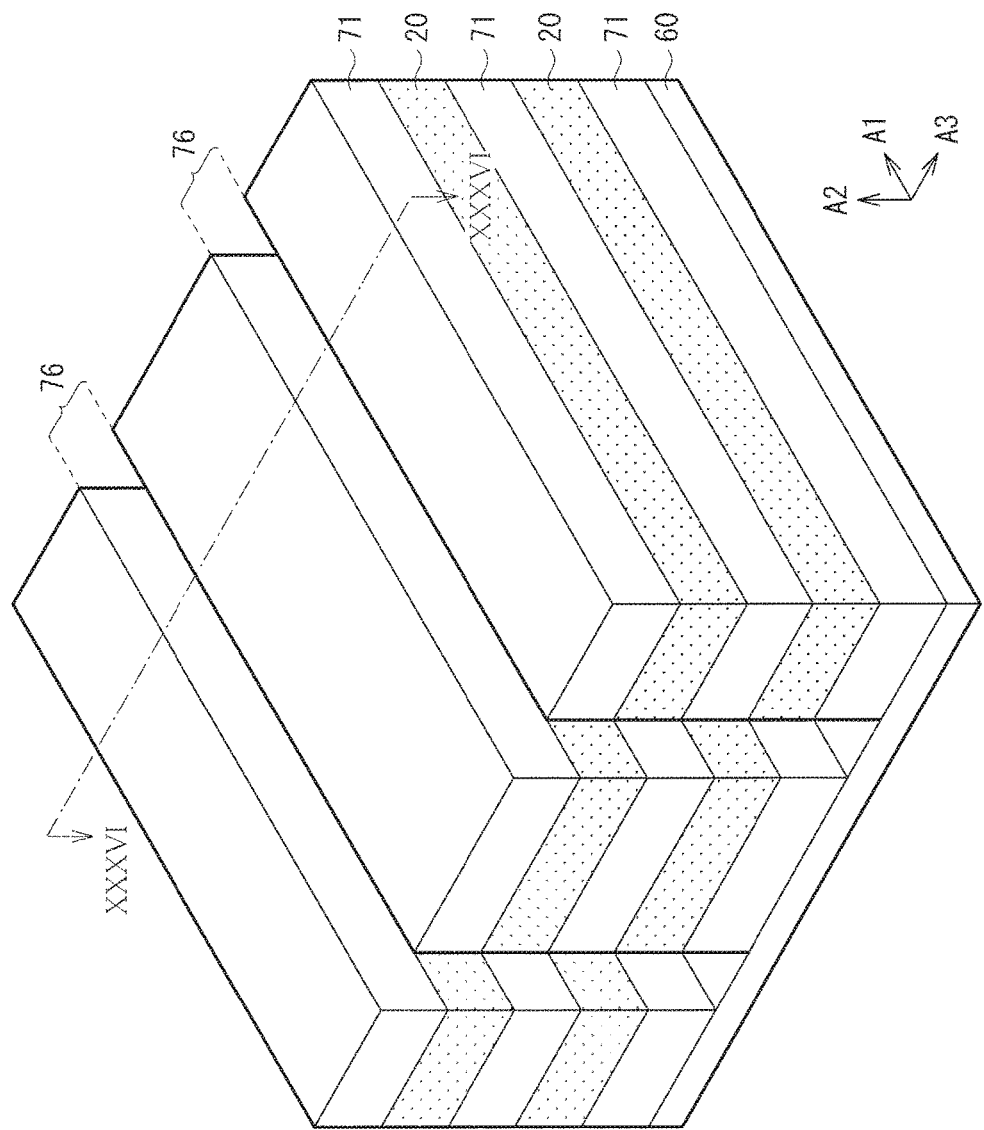

[ FIG. 36 ]
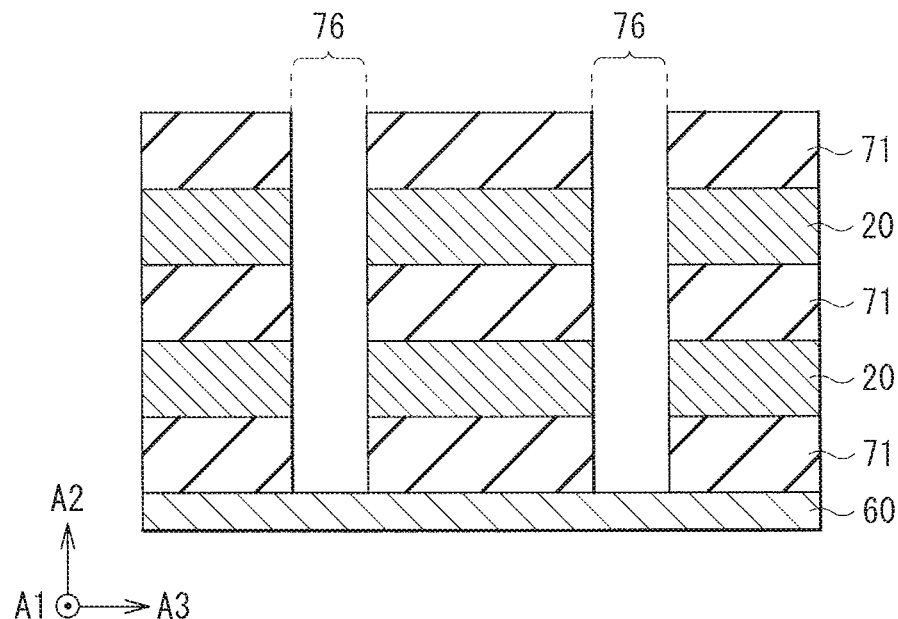
[ FIG. 37 ]
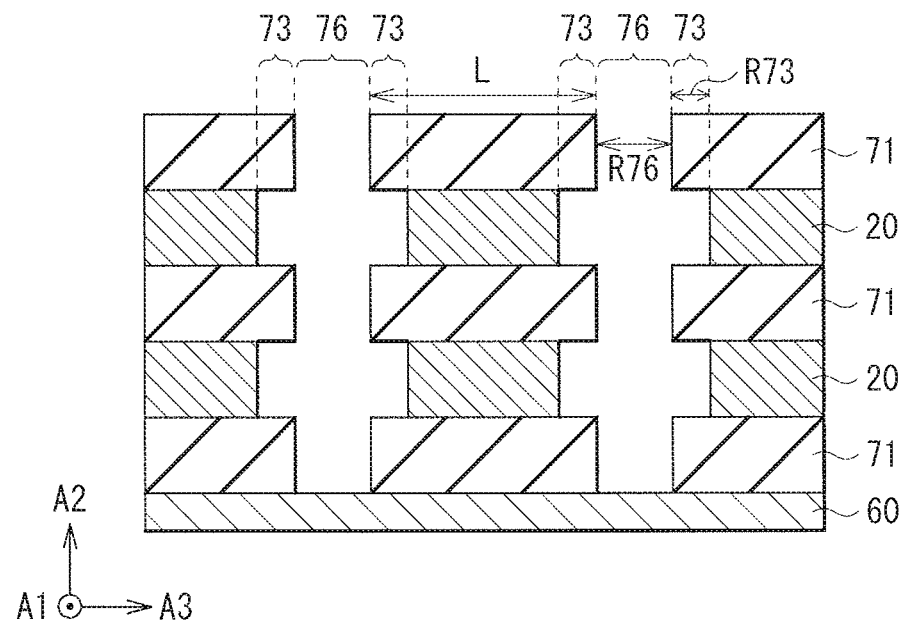

[ FIG. 38 ]
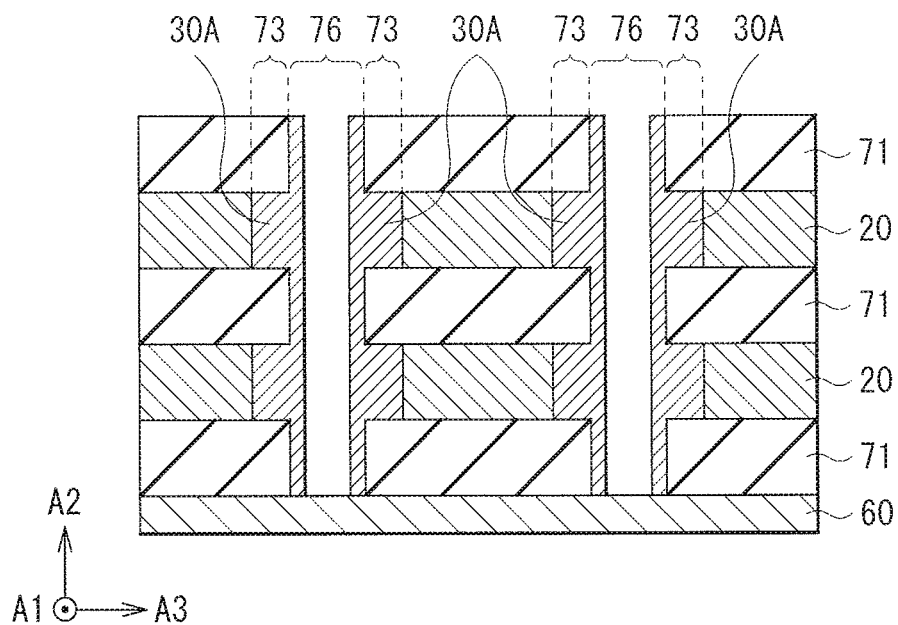
[ FIG. 39 ]
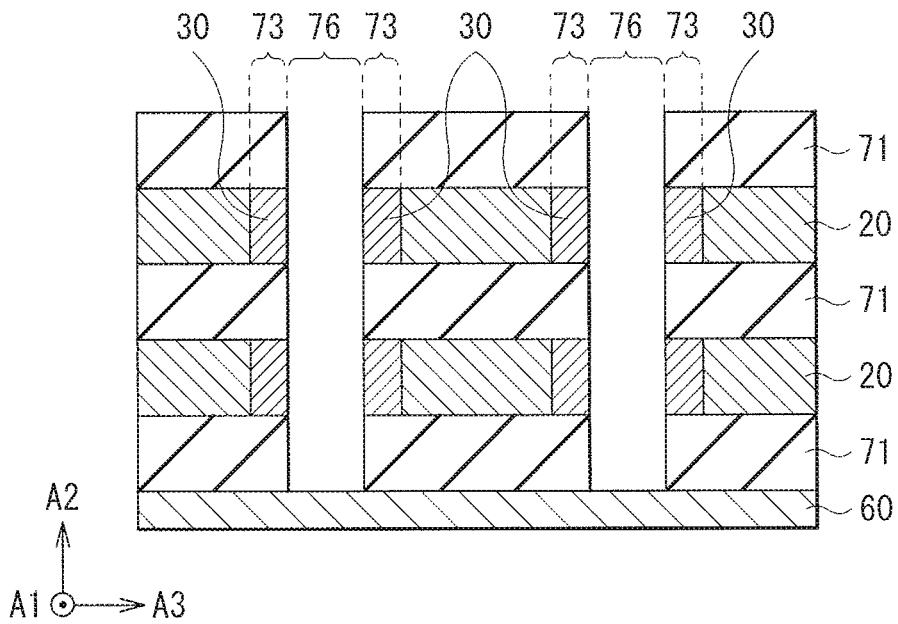

[ FIG. 40 ]
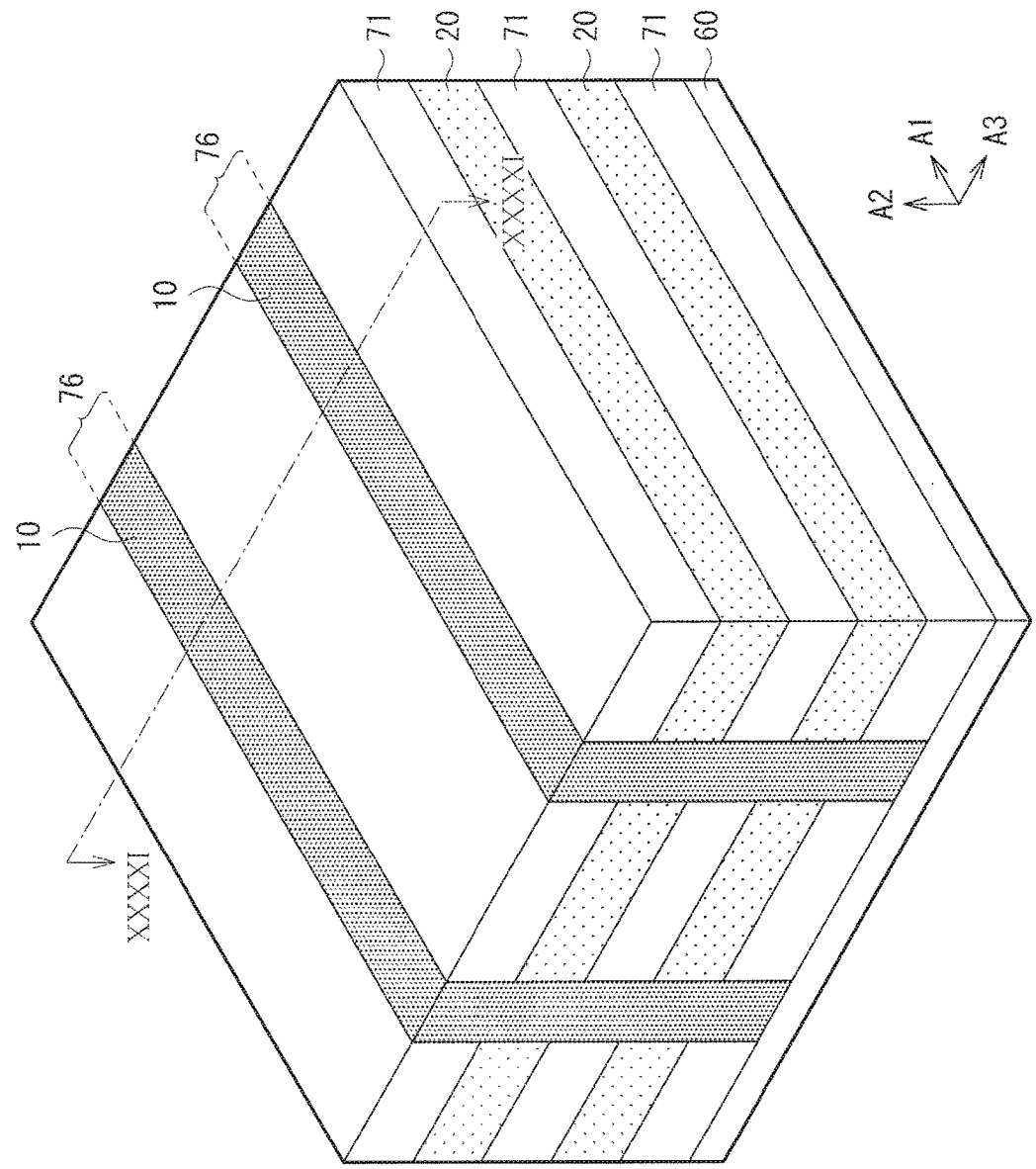

[ FIG. 41 ]
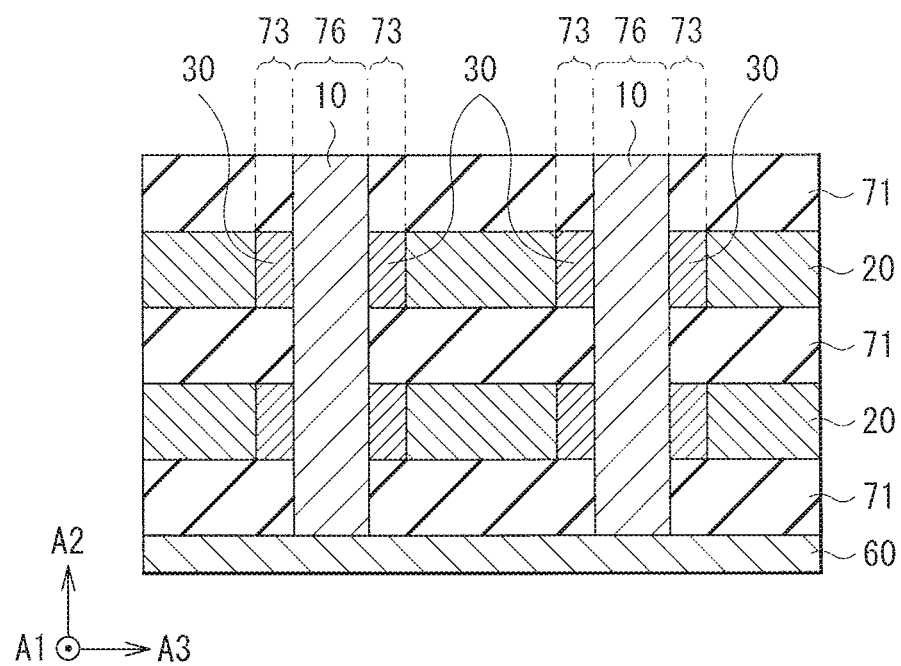

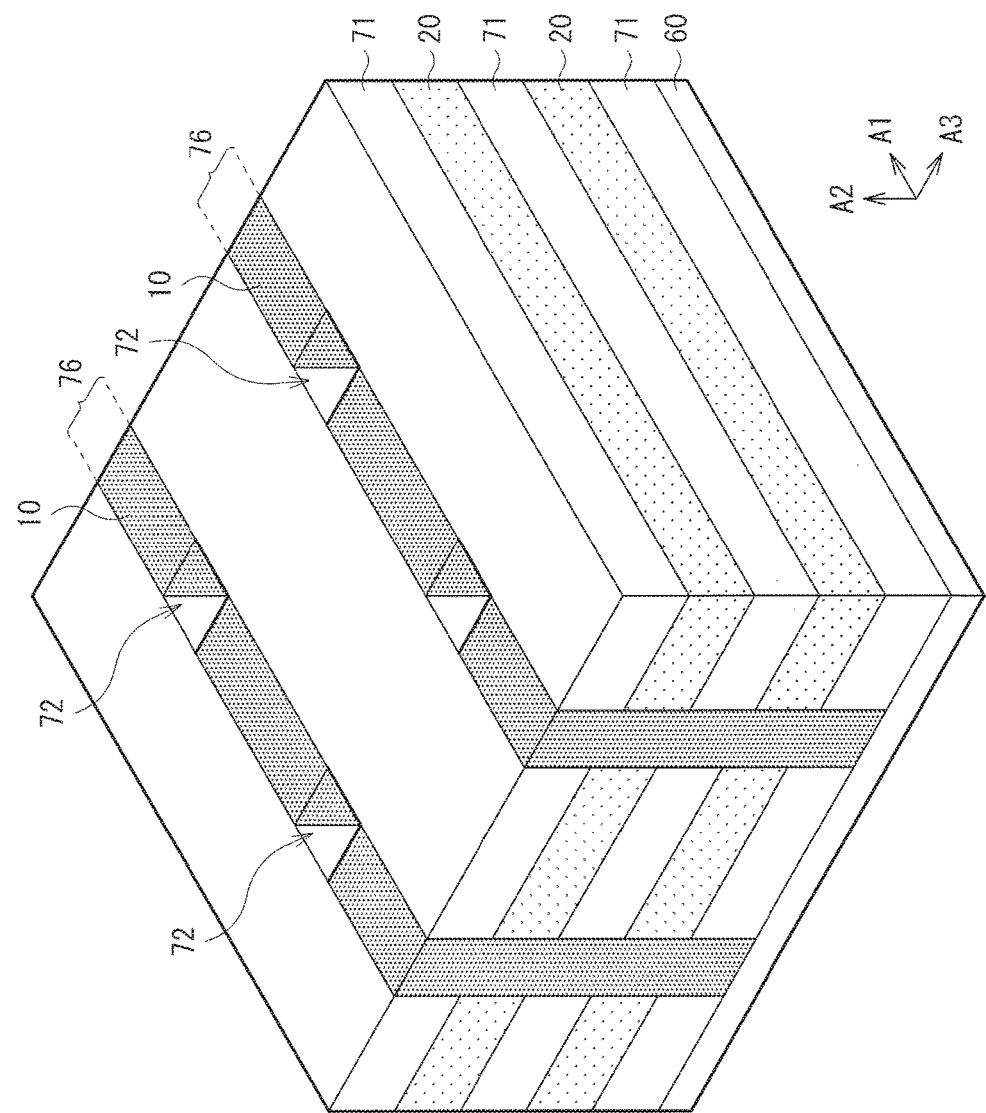
[ FIG. 42 ]

[FIG. 43]
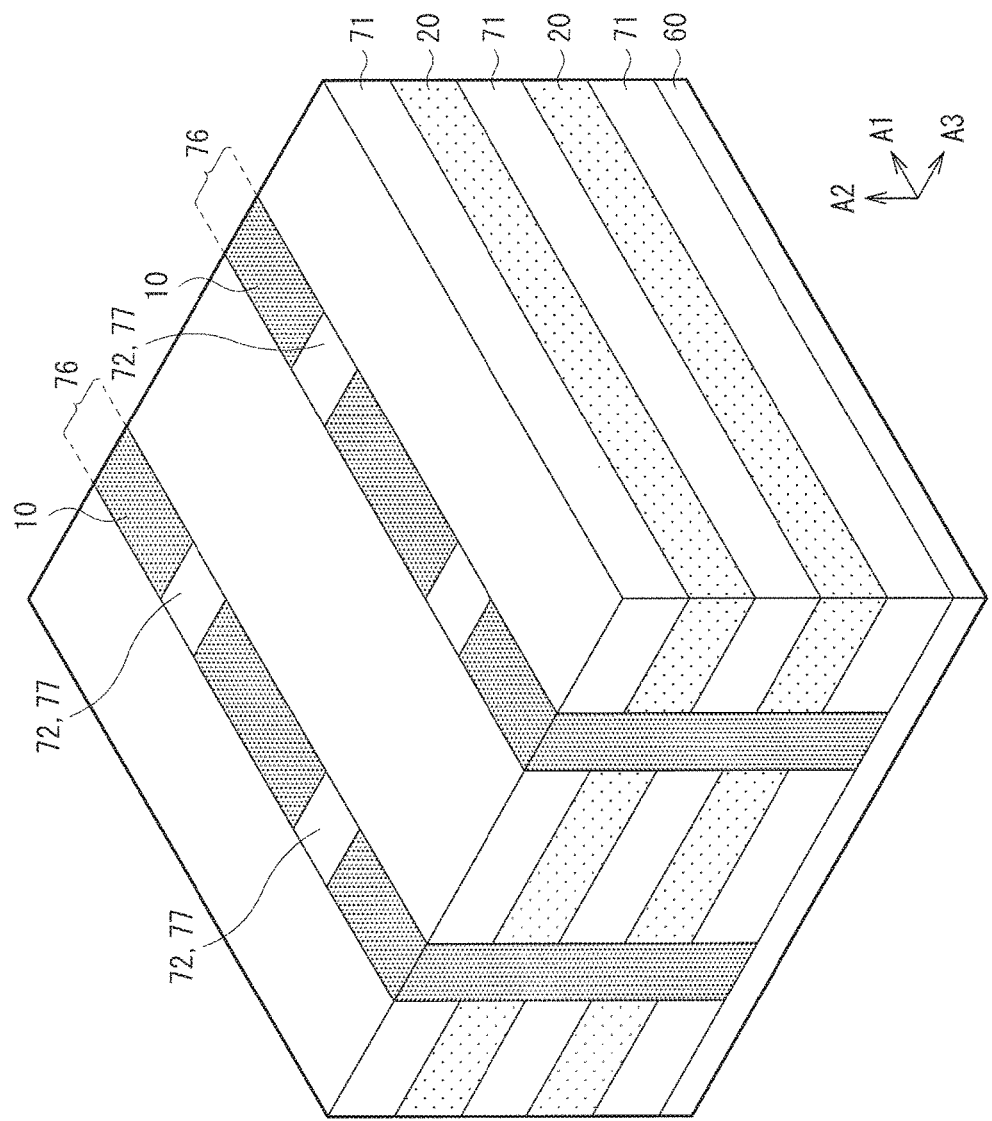

[ FIG. 44 ]
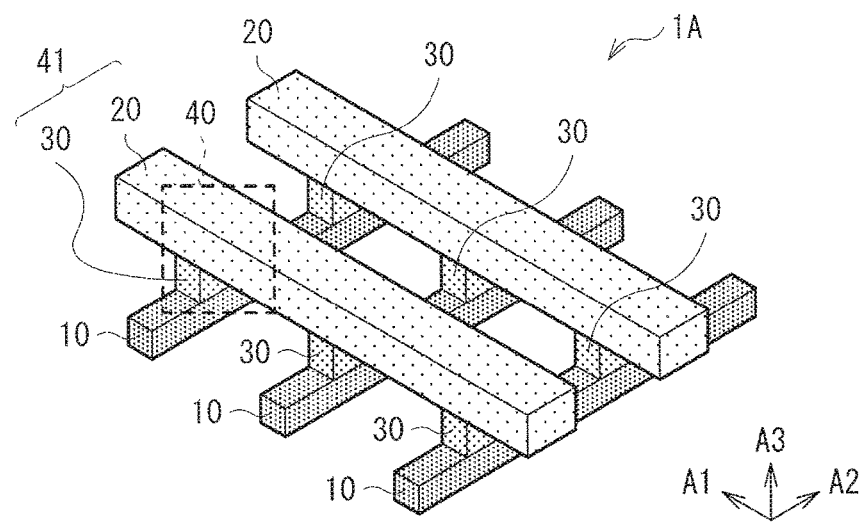
[ FIG. 45 ]
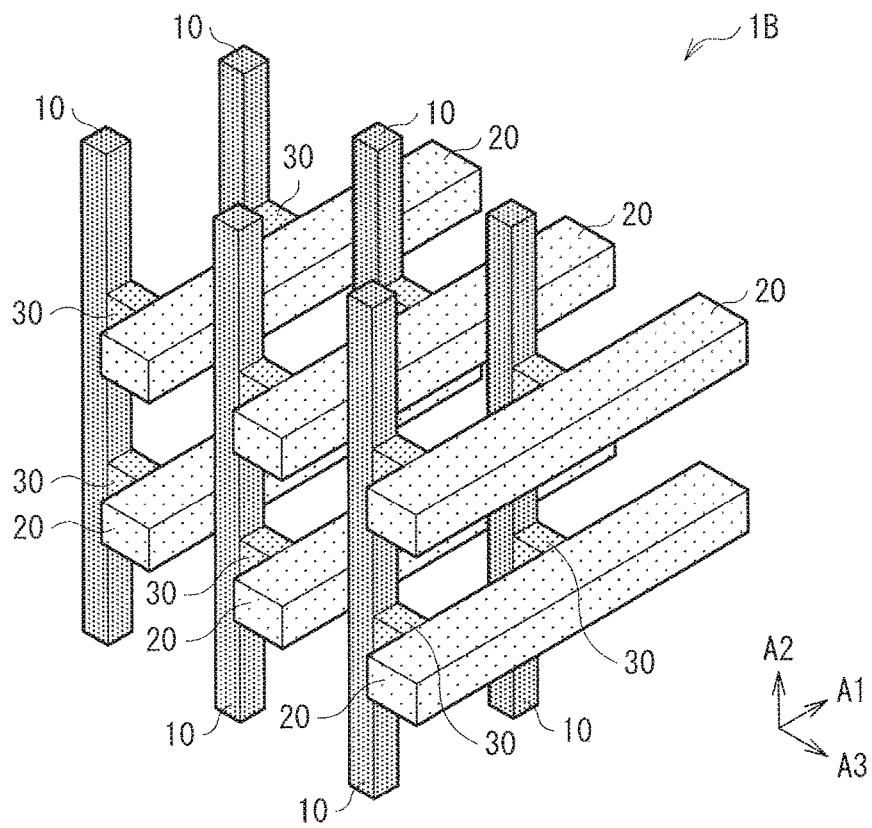

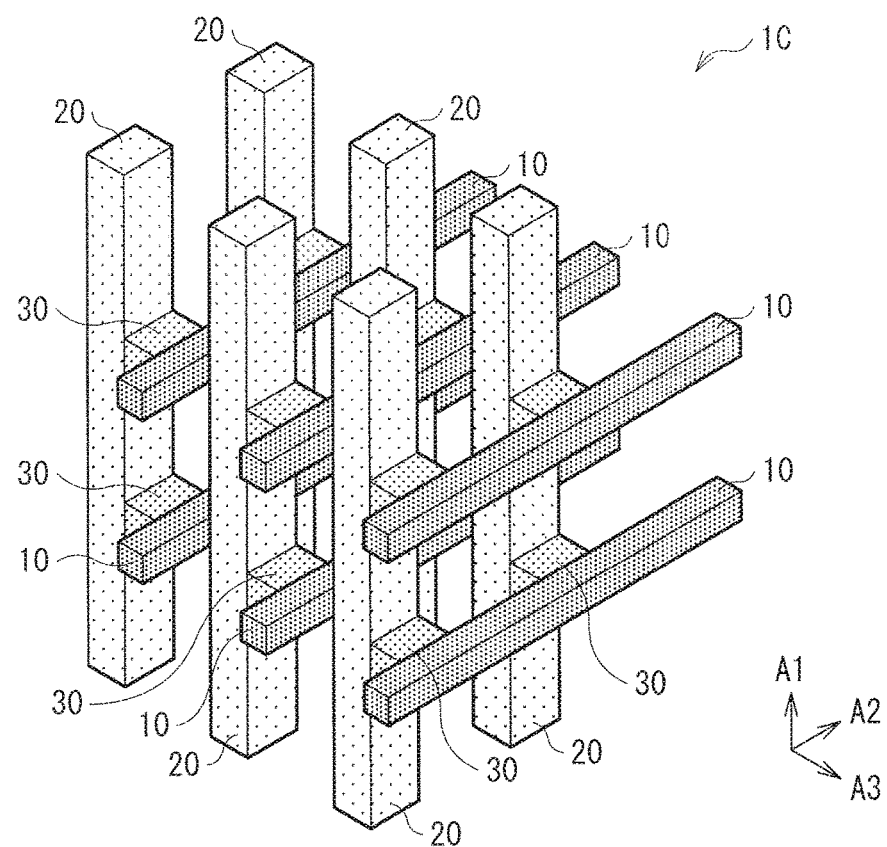
[FIG. 46]

[FIG. 47]
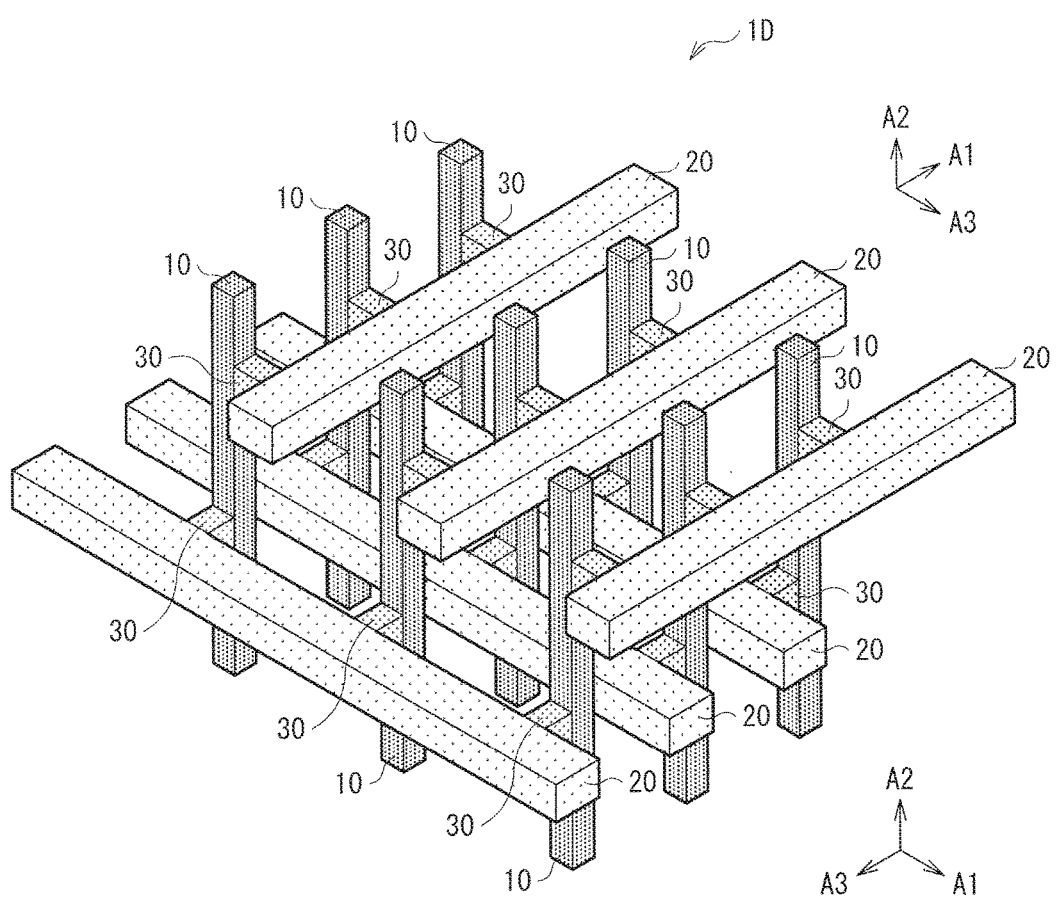

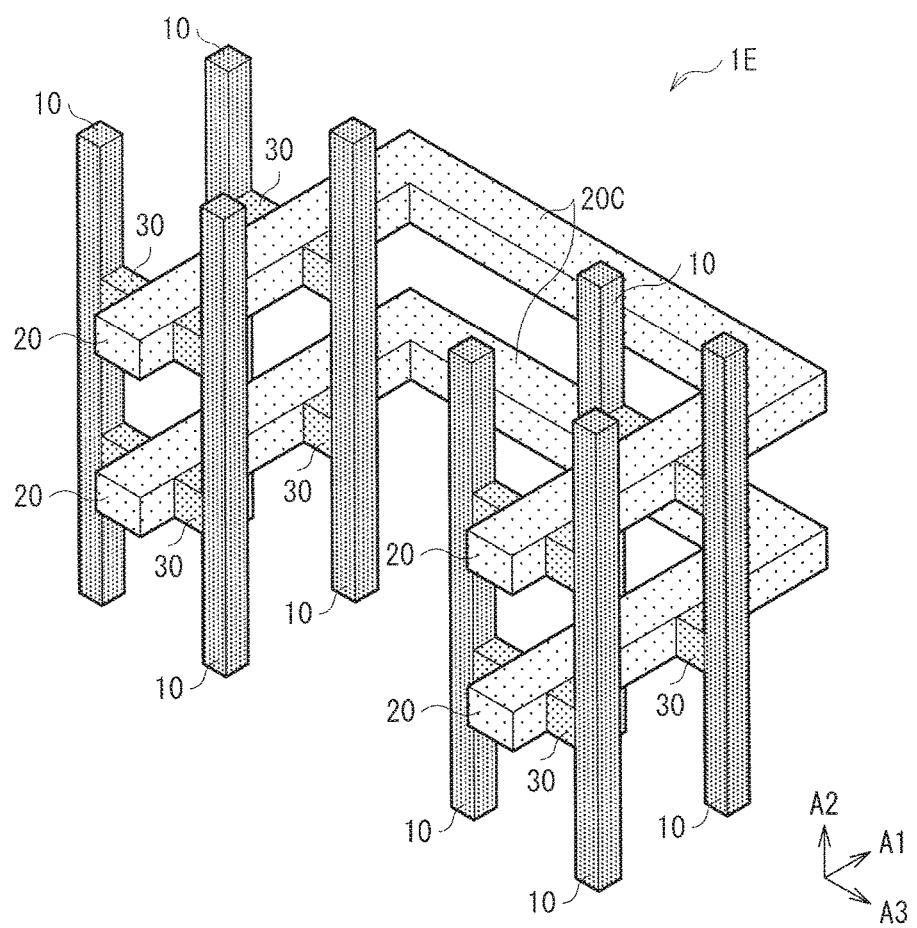
[ FIG. 48 ]

[ FIG. 49 ]
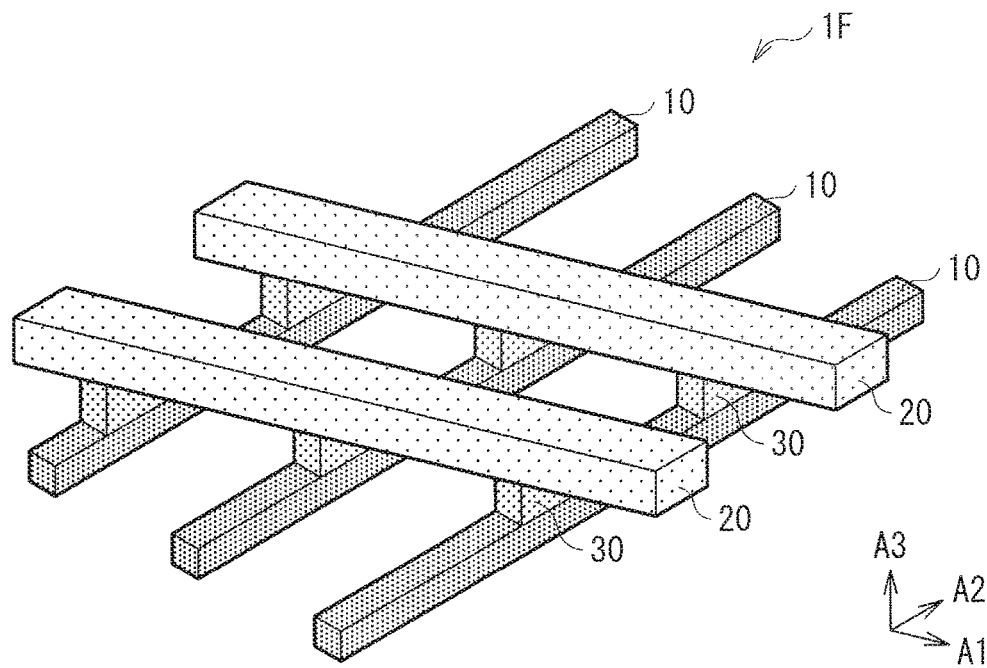
[ FIG. 50 ]
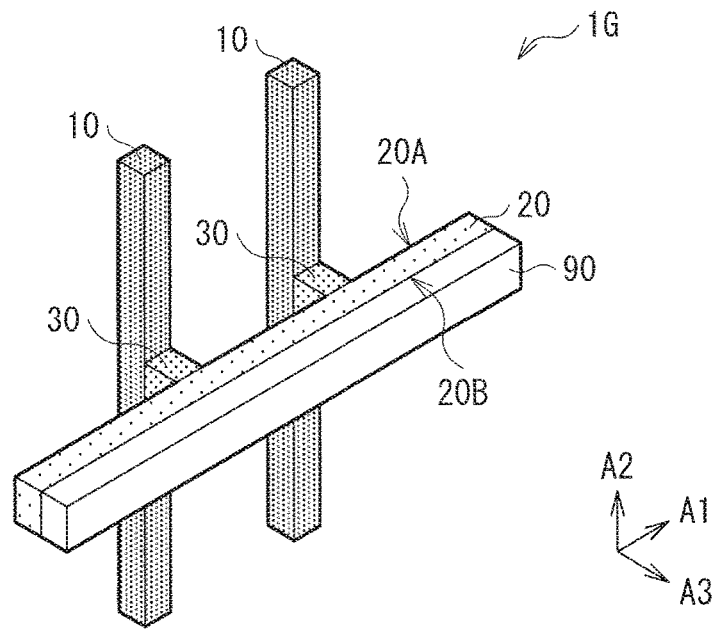

[ FIG. 51 ]
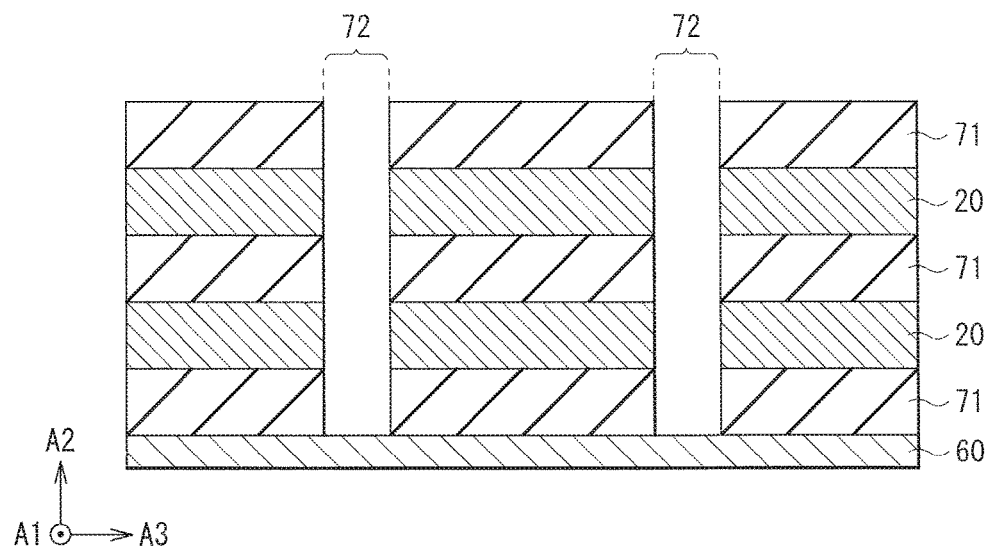
[ FIG. 52 ]
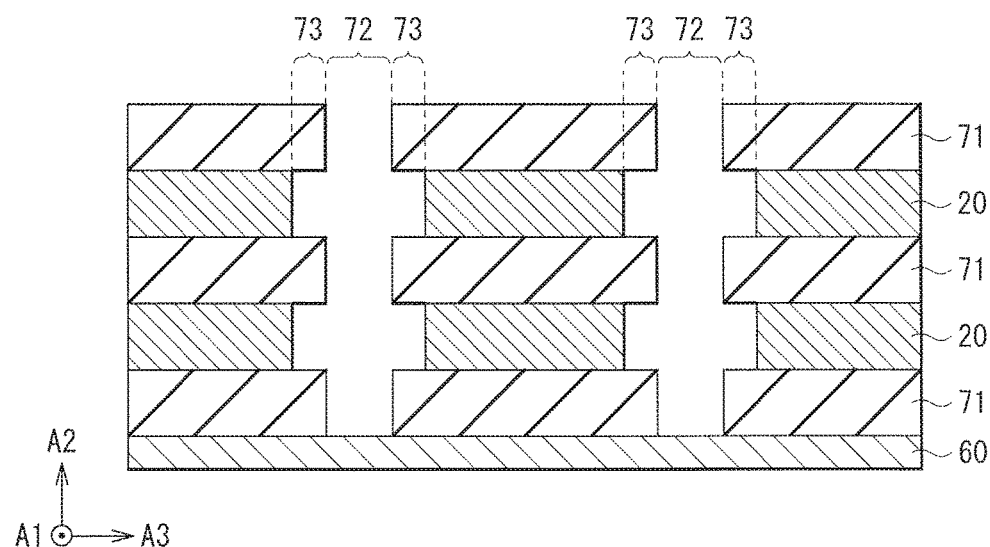

[ FIG. 53 ]
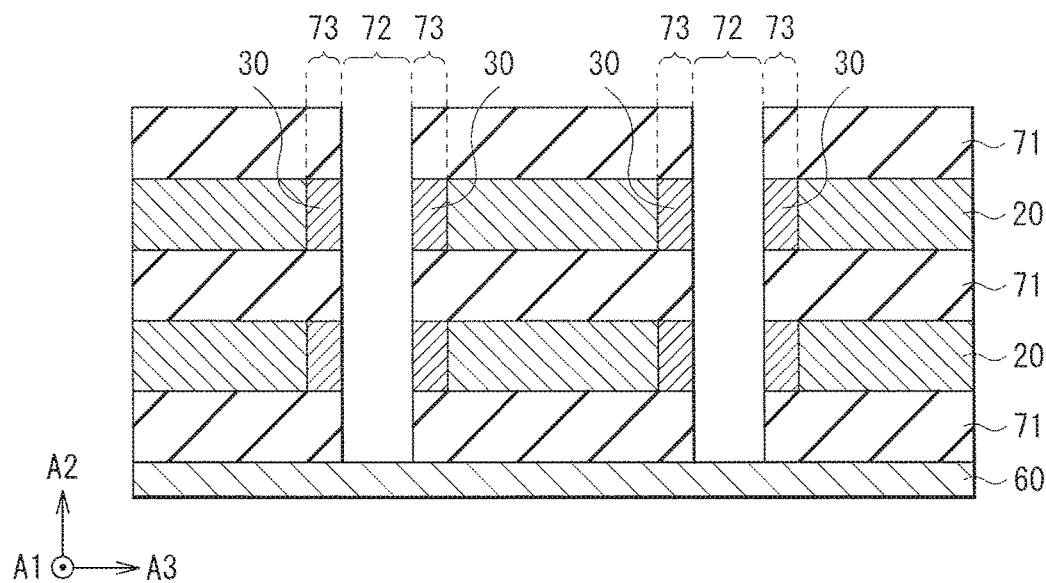
[ FIG. 54 ]
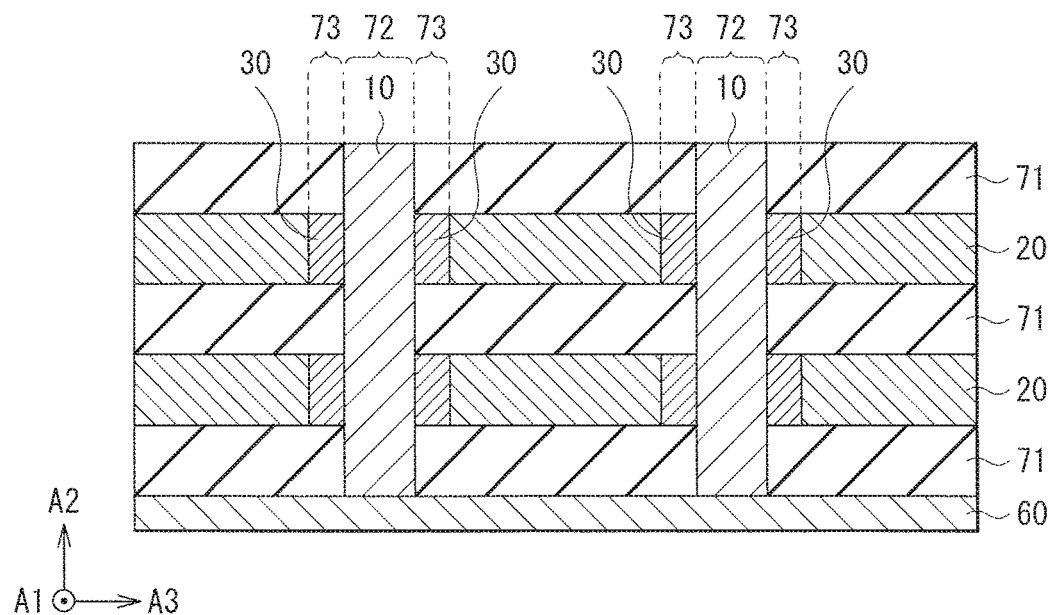

[ FIG. 55 ]
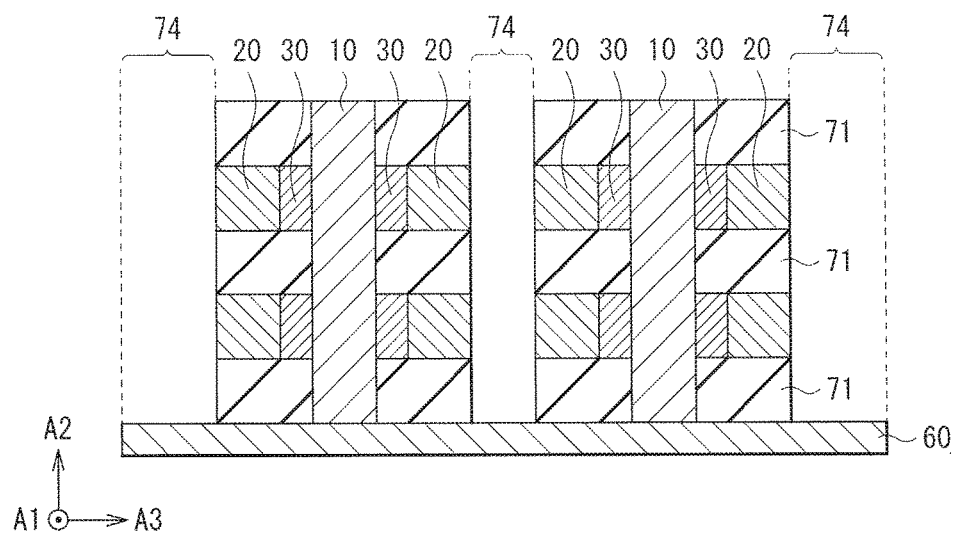
[ FIG. 56 ]
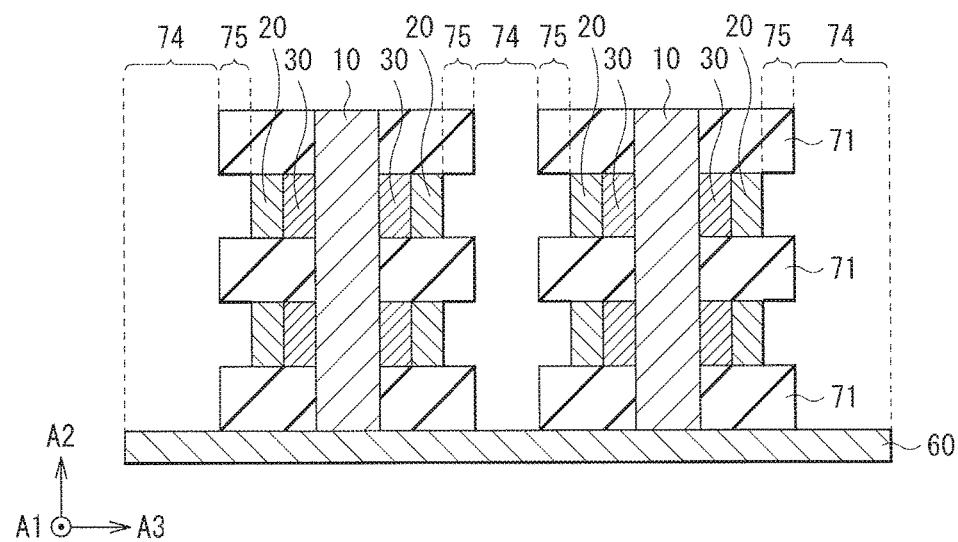

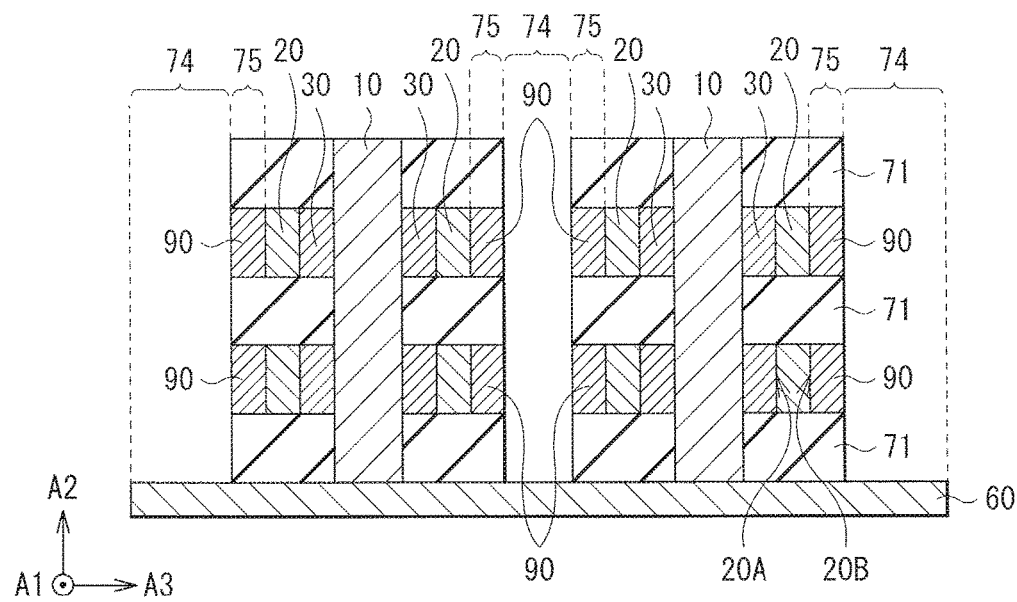
[ FIG. 57 ]

MEMORY DEVICE AND METHOD OF MANUFACTURING MEMORY DEVICE

TECHNICAL FIELD

The present disclosure relates to a memory device including a plurality of memory cells and a method of manufacturing the memory device, and specifically relates to a memory device including a plurality of memory cells that each include a variable resistance layer between an electrode and an ion source layer, and a method of manufacturing the memory device.

BACKGROUND ART

One technique for micro-miniaturization and a larger capacity of a memory is to extend a memory into a three dimensional structure, and various structures or processes have been proposed recently. For example, Patent Literature 1 discloses a nonvolatile memory cell in which first electrodes and second electrodes intersect with data storage layers, metal silicide layers, and joint layers provided at intersections.

CITATION LIST

Patent Literature

Patent Literature 1: JP 2010-10688A (FIG. 1)

SUMMARY OF INVENTION

However, in Patent Literature 1, the data storage layers and the forth are provided in gaps at the intersections of the first electrodes and the second electrodes. There was therefore a disadvantage of difficulties in micro-miniaturization in a direction perpendicular to both the first electrodes and the second electrodes (i.e., a direction in which the first electrode and the second electrode face each other with the data storage layer and the forth interposed therebetween. Hereinbelow referred to as "a third direction").

It is therefore desirable to provide a memory device that makes it possible to attain micro-miniaturization, and a method of manufacturing the memory device.

A memory device according to an embodiment of the present disclosure includes a plurality of memory cells that each include an electrode and a storage layer, in which the storage layer is configured of a plurality of layers. One layer of the plurality of layers is extended in a first direction and is shared by the plurality of memory cells arranged in the first direction. The electrode is extended in a second direction and is shared by the plurality of memory cells arranged in the second direction, in which the second direction is different from the first direction.

In the memory device according to the embodiment of the present disclosure, application of voltage to the electrode allows electrical property (a resistance value) of the storage layer to change to a low resistance state (a written state) or a high resistance state (an erased state).

It is to be noted that correspondence between writing/erasing operations and lowering/increasing resistance is matters on definition; herein, the low resistance state is defined as the written state while the high resistance state is defined as the erased state.

A method of manufacturing a memory device according to an embodiment of the present disclosure is a method of manufacturing a memory device including a plurality of memory cells that each include an electrode and a storage layer, in which the storage layer is configured of a plurality of layers. The method includes the following (A) to (E).

(A) forming, on a substrate, one layer of the plurality of layers to extend in a first direction (B) forming a separation insulating film in a separation groove in the one layer (C) forming, in the separation insulating film, a hole structure in a second direction, allowing the one layer to be exposed in an inner surface of the hole structure, the second direction being different from the first direction (D) forming one or more remaining layers of the plurality of layers on the inner surface of the hole structure (E) filling the hole structure with the electrode According to the memory device of the embodiment of the present disclosure, the one layer of the plurality of layers that constitutes the storage layer is extended in the first direction and is shared by the plurality of memory cells arranged in the first direction, while the electrode is extended in the second direction and is shared by the plurality of memory cells arranged in the second direction, in which the second direction is different from the first direction. Hence, it is possible to attain micro-miniaturization in a third direction perpendicular to both the first direction and the second direction.

According to the method of manufacturing the memory device of the embodiment of the present disclosure, the one layer of the plurality of layers is formed, on the substrate, to extend in the first direction. The separation insulating film is formed in the separation groove in the one layer. In the separation insulating film, the hole structure is formed in the second direction different from the first direction. The one or more remaining layers of the plurality of layers are formed on the inner surface of the hole structure. The hole structure is filled with the electrode. Hence, it is possible to facilitate manufacturing of the memory device of the above-described embodiment of the present disclosure.

BRIEF DESCRIPTION OF DRAWINGS

FIG. 1 is a perspective view illustrating a basic configuration of a memory device according to a first embodiment of the present disclosure.

FIG. 2 is a perspective view illustrating an overall configuration of the memory device illustrated in FIG. 1.

FIG. 3 is a cross-sectional view illustrating a configuration of the memory device illustrated in FIG. 2.

FIG. 4 is a perspective view illustrating a basic configuration of a memory device according to a reference example.

FIG. 5 is a cross-sectional view illustrating a configuration of the memory device according to the reference example illustrated in FIG. 4.

FIG. 6 is a perspective view illustrating a method of manufacturing the memory device illustrated in FIG. 3 in the order of procedure.

FIG. 7 is a perspective view illustrating a process following FIG. 6.

FIG. 8 is a perspective view illustrating a process following FIG. 7.

FIG. 9 is a perspective view illustrating a process following FIG. 8.

FIG. 10 is a cross-sectional view along a line X-X in FIG. 9.

FIG. 11 is a cross-sectional view illustrating a process following FIG. 10.

FIG. 12 is a cross-sectional view illustrating a process following FIG. 11.

FIG. 13 is a cross-sectional view illustrating a process following FIG. 12.

FIG. 14 is a perspective view illustrating a process following FIG. 13.

FIG. 15 is a cross-sectional view along a line XV-XV in FIG. 14.

FIG. 16 is a cross-sectional view illustrating a method of manufacturing the memory device according to the reference example illustrated in FIG. 5 in the order of procedure.

FIG. 17 is a cross-sectional view illustrating a process following FIG. 16.

FIG. 18 is a cross-sectional view illustrating a process following FIG. 17.

FIG. 19 is a cross-sectional view illustrating a process following FIG. 14.

FIG. 20 is a cross-sectional view illustrating a process following FIG. 19.

FIG. 21 is a diagram illustrating an example of a written state of the memory device illustrated in FIG. 1.

FIG. 22 is a diagram illustrating an example at the time of application of an erase voltage to the memory device illustrated in FIG. 1.

FIG. 23 is a diagram illustrating an example of an erased state of the memory device illustrated in FIG. 1.

FIG. 24 is a diagram illustrating another example of the written state of the memory device illustrated in FIG. 1.

FIG. 25 is a diagram illustrating another example at the time of the application of the erasing voltage to the memory device illustrated in FIG. 1.

FIG. 26 is a diagram illustrating another example of the erased state of the memory device illustrated in FIG. 1.

FIG. 27 is a cross-sectional view illustrating a configuration of a testing device used in a preliminary experiment to examine influences of a thickness of an ion source layer on memory characteristics.

FIG. 28 is a circuit diagram illustrating a measurement system of the preliminary experiment.

FIG. 29 is a diagram illustrating voltage waveforms applied to the testing device in the preliminary experiment.

FIG. 30 is a diagram illustrating a result of the preliminary experiment (a relation between the thickness of the ion source layer and variation in set resistance).

FIG. 31 is a planar view illustrating a layer configuration to be formed inside a hole structure, in the method of manufacturing the memory device according to the reference example illustrated in FIGS. 18 to 20.

FIG. 32 is a diagram illustrating a relation between the thickness of the ion source layer and the variation in set resistance in the memory device according to the present embodiment illustrated in FIG. 1, in comparison with that of the memory device according to the reference example.

FIG. 33 is a planar view illustrating the layer configuration to be formed inside the hole structure, in the method of manufacturing the memory device according to the present embodiment illustrated in FIGS. 12 to 15.

FIG. 34 is a perspective view illustrating a method of manufacturing a memory device according to a second embodiment of the present disclosure in the order of procedure.

FIG. 35 is a perspective view illustrating a process following FIG. 34.

FIG. 36 is a cross-sectional view along a line XXXVI-XXXVI in FIG. 35.

FIG. 37 is a cross-sectional view illustrating a process following FIG. 36.

FIG. 38 is a cross-sectional view illustrating a process following FIG. 37.

FIG. 39 is a cross-sectional view illustrating a process following FIG. 38.

FIG. 40 is a perspective view illustrating a process following FIG. 39.

FIG. 41 is a cross-sectional view along a line XXXXI-XXXXI in FIG. 40.

FIG. 42 is a perspective view illustrating a process following FIG. 41.

FIG. 43 is a perspective view illustrating a process following FIG. 42.

FIG. 44 is a perspective view illustrating a configuration of a memory device according to a modification example 1.

FIG. 45 is a perspective view illustrating a configuration of a memory device according to a modification example 2.

FIG. 46 is a perspective view illustrating a configuration of a memory device according to a modification example 3.

FIG. 47 is a perspective view illustrating a configuration of a memory device according to a modification example 4.

FIG. 48 is a perspective view illustrating a configuration of a memory device according to a modification example 5.

FIG. 49 is a perspective view illustrating a configuration of a memory device according to a modification example 6.

FIG. 50 is a perspective view illustrating a basic configuration of a memory device according to a third embodiment of the present disclosure.

FIG. 51 is a cross-sectional view illustrating a method of manufacturing the memory device illustrated in FIG. 50 in the order of procedure.

FIG. 52 is a cross-sectional view illustrating a process following FIG. 51.

FIG. 53 is a cross-sectional view illustrating a process following FIG. 52.

FIG. 54 is a cross-sectional view illustrating a process following FIG. 53.

FIG. 55 is a cross-sectional view illustrating a process following FIG. 54.

FIG. 56 is a cross-sectional view illustrating a process following FIG. 55.

FIG. 57 is a cross-sectional view illustrating a process following FIG. 56.

DESCRIPTION OF EMBODIMENTS

In the following, some embodiments of the present disclosure will be described in detail with reference to the drawings. It is to be noted that the order of description is as follows.

1. First Embodiment (an example in which an ion source layer is extended in parallel with a substrate, an electrode is extended perpendicularly to the substrate, and a variable resistance layer is provided between the ion source layer and the electrode)

2. Modification Example 1 (an example in which the ion source layer and the electrode are extended perpendicularly to each other in a plane parallel to the substrate)

3. Modification Example 2 (an example in which the variable resistance layer is provided on one side of the electrode)

4. Modification Example 3 (an example in which the ion source layer is extended perpendicularly to the substrate, the electrode is extended in parallel with the substrate, and the variable resistance layer is provided on one side of the electrode)

5. Modification Example 4 (an example in which the ion source layer is extended in two different directions in the plane parallel to the substrate)

6. Modification Example 5 (an example in which part of the ion source layer is connected)

7. Modification Example 6 (an example in which, in Modification Example 1, the ion source layer and the electrode are extended to intersect at a different angle from a right angle)

8. Third Embodiment (an example in which a backing layer is provided in contact with a second surface of the ion source layer)

9. Fourth Embodiment (an example in which the variable resistance layer has a function of a diode)

First Embodiment

FIG. 1 illustrates a basic configuration of a memory device according to a first embodiment of the present disclosure. FIG. 2 illustrates an overall configuration of the memory device illustrated in FIG. 1. FIG. 3 illustrates a cross-sectional configuration along a line III-III in FIG. 2, respectively. The memory device 1 may be a three-dimensional memory array in which a plurality of electrodes 10 and a plurality of ion source layers 20 intersect in a three-dimensional lattice network shape, and variable resistance layers 30 are disposed at intersections. A portion in which the variable resistance layer 30 is interposed between the electrode 10 and the ion source layer 20 may constitute one memory element (memory cell) 40. The ion source layer 20 and the variable resistance layer 30 may constitute a storage layer 41 of the memory cell 40. It is to be noted that an end of the ion source layer 20 may be connected to a pad electrode 51 for voltage application.

The electrode 10 may be provided on, for example, a substrate 60 (refer to FIG. 3). The substrate 60 may be made of silicon and may include a CMOS (Complementary Metal Oxide Semiconductor) circuit formed thereon. The electrode 10 may serve as a connecting section to the CMOS circuit portion. The electrode 10 may be, for example, a linear electrode extended in a direction perpendicular to the substrate 60. It is to be noted that the substrate 60 may be provided with a wiring layer and a selecting element, and may include a structure to allow for selection of any electrode 10 from the plurality of electrodes 10, depending on operation methods.

The electrode 10 may be configured of a wiring material used in semiconductor processes. Examples may include tungsten (W), tungsten nitride (WN), copper (Cu), aluminum (Al), molybdenum (Mo), tantalum (Ta), silicide, and so forth. In a case that the electrode 10 is configured of a material such as Cu that has a possibility of occurrence of ion conduction due to an electric field, a surface of the electrode 10 made of Cu or the like may be covered with a material such as W, WN, titanium nitride (TiN), or tantalum nitride (TaN) that is unlikely to cause ion conduction or thermal diffusion.

The ion source layer 20 may constitute part of the storage layer 41 of the memory cell 40, together with the variable resistance layer 30. A first surface 20A of the ion source layer 20 may be in contact with the variable resistance layer 30. The ion source layer 20 may be connected to the pad electrode 51. As illustrated in FIG. 3, the ion source layer 20 may be a linear layer extended in a direction parallel to the substrate 60. The ion source layer 20 and the electrode 10 may intersect perpendicularly with each other. The ion source layer 20 may form a stacked structure in which the ion source layer 20 and an interlayer insulating layer 71 are stacked alternatively on the substrate 60. The interlayer insulating layer 71 may be configured of silicon oxide ($SiO_2$), silicon nitride ($Si_xN_y$), or the like.

The ion source layer 20 may include, for example, as an ion conductive material to be anionized, at least one chalcogen element such as tellurium (Te), sulfur (S), and selenium (Se). The ion source layer 20 may further include oxygen. Moreover, the ion source layer 20 may include a transition metal element as a metal element capable of being cationized. The transition metal element may be, for example, one, or two or more selected from Group 4 titanium group {titanium (Ti), zirconium (Zr), hafnium (Hf)}, Group 5 vanadium group {vanadium (V), niobium (Nb), tantalum (Ta)}, and Group 6 chromium group {chromium (Cr), molybdenum (Mo), tungsten (W)} of the Periodic Table.

In the ion source layer 20, the above-mentioned transition metal element, the chalcogen element, and the oxygen may be bonded together to form a metal chalcogenide oxide layer. The metal chalcogenide oxide layer may include mainly an amorphous structure, and may serve as an ion supply source.

The variable resistance layer 30 may be provided between the electrode 10 and the ion source layer 20. The variable resistance layer 30 may be configured so that application of voltage to the electrode 10 and the pad electrode 51 allows a low resistance portion (a conductive path) to be formed to cause a change in a resistance value. The low resistance portion may include the above-mentioned transition metal element or may include an oxygen defect. The variable resistance layer 30 may be configured of, for example, an oxide film, a nitride film, or an oxynitride film of a metal element.

It is to be noted that the conductive path including the above-mentioned transition metal element is chemically stable in the vicinity of the ion source layer 20 or in the variable resistance layer 30, as compared to other transition metal elements, is likely to form a medium oxidized state or maintain such a state. This contributes to improvement in controllability of a resistance value and data storage performance of the memory cell 40.

Moreover, in the conductive path made of the transition metal element or in the vicinity thereof, there may be formed three states i.e., "a metal state/a chalcogen compound state/an oxide state" whose resistance values are "low/medium/high values", respectively. The resistance value of the variable resistance layer 30 may be determined by a mixed state of the three states. Changing the mixed state of the three states allows the variable resistance layer 30 to have various values (medium resistance values). Here, the above-mentioned transition metal element is used that allows for formation of the chemically stable conductive path having the medium resistance value as described above. This leads to improvement in the controllability of the resistance value, in particular, the medium resistance value and the data storage performance in the memory cell 40.

There is no specific limitation on a metal material for the variable resistance layer 30, as long as the variable resistance layer 30 is a layer having high resistance, for example, a value approximately from several MΩ to several hundred GΩ in an initial state. For example, in a case of using a metal oxide as a material of the variable resistance layer 30, it is desirable that Zr, Hf, Al, a rare earth element and so forth which forms a metal oxide having high resistance, i.e., having a large bandgap be used as the metal element. Moreover, in a case of using a metal nitride, it is also desirable that Zr, Hf, Al, a rare earth element and so forth be used as the metal element since they allow for a resistance value approximately from several MΩ to several hundred GΩ and are likely to have high resistance due to oxidation of the conductive path resulting from travel of oxygen in an erasing operation. Furthermore, likewise, in a case of using a metal oxynitride, a metal atom that is capable of attaining a resistance value approximately from several MΩ to several hundred GΩ may be used. The variable resistance layer 30 may have any thickness as long as the above-mentioned element resistance approximately from several MΩ to several hundred GΩ is attained. An optimum value of the thickness may be varied depending on a size of the element or a resistance value of the ion source layer 20. Preferably, the thickness of the variable resistance layer 30 may be, for example, about 1 nm to 10 nm both inclusive.

Specific examples of materials of the variable resistance layer 30 may include NiO, MnO, $Cr_2O_3$, $Mn_2O_3$, $Fe_2O_3$, $CuO_2$, $TiO_2$, $ZrO_2$, HfOx, ZnO, and so forth. Among them, a transition metal oxide may be preferable.

It is to be noted that it is not necessary to form the variable resistance layer 30 purposely. During a process of manufacturing the memory cell 40, the transition metal element and the oxygen contained in the ion source layer 20 are bonded so that a metal oxide film that will eventually serve as the variable resistance layer 30 is naturally formed on the electrode 10. Alternatively, an oxide film that is formed by application of a bias voltage in an erase direction will eventually serve as the variable resistance layer 30.

The pad electrode 51 may be connected to, for example, an end of the ion source layer 20. It is not necessary that the pad electrode 51 faces the electrode 10. For the pad electrode 51, a known semiconductor wiring material may be used, similarly to the electrode 10. A stable material that is unlikely to react with the ion source layer 20 after being subjected to post annealing may be preferable. Moreover, it is not necessary that the pad electrode 51 contains a substance that diffuses in the ion source layer 20.

In the present embodiment, the ion source layer 20 is extended in a first direction A1 and is shared by the plurality of memory cells 40 arranged in the first direction A1. The electrode 10 is extended in a second direction A2 and is shared by the plurality of memory cells 40 arranged in the second direction A2. The second direction A2 is different from the first direction A1. Hence, in the memory device 1, it is possible to attain micro-miniaturization in a third direction A3 perpendicular to both the first direction A1 and the second direction A2.

More detailed description on this will be given in comparison with a memory device according to a reference example illustrated in FIGS. 4 and 5. It is to be noted that, in FIGS. 4 and 5, description will be given with components corresponding to those in FIGS. 1 to 3 denoted by the same reference numerals in the hundreds.

The memory device 101 according to the reference example may have a configuration in which a plurality of first electrodes 110 (in the first direction A1) and a plurality of second electrodes 150 (in the second direction A2) intersect with one another, and ion source layers 20 and variable resistance layers 130 are provided therebetween at intersections. A portion in which the ion source layer 120 and the variable resistance layer 130 are interposed between the first electrode 110 and the second electrode 150 may constitute one memory cell 140.

Thus, in the memory device 101 according to the reference example, the first electrode 110 and the second electrode 150 are spaced apart at the intersection thereof by a distance of a total sum of thicknesses of the ion source layer 120 and the variable resistance layer 130. This leads to difficulties in micro-miniaturization in the third direction A3 perpendicular to both the first direction A1 and the second direction A2.

On the other hand, the memory device 1 according to the present embodiment includes the ion source layer 20 in a linear shape, instead of the second electrode 150 of the reference example. Therefore, the electrode 10 and the ion source layer 20 may be sufficiently spaced apart at the intersection thereof by a distance of the thickness of the variable resistance layer 30. This allows for micro-miniaturization in the third direction A3 perpendicular to both the first direction A1 and the second direction A2.

In other words, in the memory device 1 according to the present embodiment, one of the two crossing electrode wirings (i.e., the second electrode 150) in the memory device according to the reference example is replaced with the ion source layer 20, allowing either of the electrode wirings to have a function as part of the storage layer 41. Conversely, in the memory device 101 according to the reference example, the memory cell 140 is provided with the second electrode 150 and the ion source layer 120 separately, while the memory cell 40 according to the present embodiment allows the ion source layer 20 to have a function as an opposing electrode (a second electrode) with respect to the electrode 10 (a first electrode).

Furthermore, in the present embodiment, as illustrated in FIG. 2, the variable resistance layer 30 is provided on both sides of the electrode 10. Therefore, as illustrated in FIG. 3, the ion source layer 20 is shared by the plurality of memory cells 401, 402 adjacent to one another in the third direction A3 perpendicular to both the first direction A1 and the second direction A2. It is to be noted that the memory cells 402, 403 sharing the electrode 10 include their respective ion source layers 20.

The memory device 1 may be manufactured, for example, as follows.

FIGS. 6 to 15 illustrate a method of manufacturing the memory device 1 in the order of procedure. First, as illustrated in FIG. 6, the substrate 60 is prepared. On the substrate 60, the ion source layer 20 and the interlayer insulating film 71 are stacked alternatively. The ion source layer 20 may be formed by CVD (Chemical Vapor Deposition) or sputtering. In particular, use of sputtering may allow for high-speed, uniform film deposition.

For the interlayer insulating film 71, for example, a silicon oxide film or a silicon nitride film by a plasma CVD method may be used. In a case of forming a silicon oxide film by a plasma CVD method, TEOS (tetraethoxysilane) may be used. For planarization of the interlayer insulating film 71, for example, CMP (Chemical Mechanical Polishing) may be used.

On the substrate 60, a wiring layer and a selecting element may be formed before forming a stacked structure of the ion source layer 20 and the interlayer insulating film 71. The substrate 60 may include a structure to allow for selection of any electrode 10 from the plurality of electrodes 10, depending on operation methods. Moreover, in this case, an etching stopper film, an insulating film, a conductive film, or the like may be appropriately formed. The etching stopper film may be provided for forming a hole structure 72, which will be described later.

Next, by patterning and etching, as illustrated in FIG. 7, the ion source layer 20 and the interlayer insulating film 71 are extended in the first direction A1 (the direction parallel to the substrate 60). The ion source layer 20 is patterned in a shape of a plurality of parallel lines extending in the first direction A1. The adjacent ion source layers 20 are separated from one another by a separation groove 76.

Subsequently, as illustrated in FIG. 8, the separation groove 76 is filled with a separation insulating film 77. The filling of the separation insulating film 77 may be carried out by, for example, an ALD (Atomic Layer Deposition) method or a CVD method.

After this, a resist mask (not illustrated) is formed to etch part of the interlayer insulating film 71 and the ion source layer 20. Thus, as illustrated in FIGS. 9 and 10, the separation insulating film 77 is provided with a hole structure 72 in the second direction A2 (the direction perpendicular to the substrate 60) different from the first direction A1, allowing the ion source layer 20 to be exposed in an inner surface of the hole structure 72.

It is to be noted that, here, the hole structure 72 is formed in a shape of a square pillar, however, this is not limitative. Instead, the hole structure 72 may have various shapes such as a columnar shape or an elliptic cylindrical shape.

Subsequently, as illustrated in FIG. 11, the ion source layer 20 exposed in the inner surface of the hole structure 72 is made to retreat by etching. Thus, a recess 73 is formed.

After this, as illustrated in FIG. 12, on the inner surface of the hole structure 72, a variable resistance material layer 30A is formed by, for example, an ALD method or a CVD method. The variable resistance material layer 30A may be deposited continuously over the entire inner surface of the hole structure 72 and the recess 73.

After forming the variable resistance material layer 30A on the inner surface of the hole structure 72, as illustrated in FIG. 13, for example, with use of anisotropic etching (reactive ion etching), an unnecessary portion of the variable resistance material layer 30A is removed. Thus, the variable resistance layer 30 is formed in the recess 73.

It is to be noted that the variable resistance layer 30 is configured of a high resistance material. Therefore, continuity of the variable resistance layer 30 between the adjacent memory cells 40 is very unlikely to affect the adjacent memory cells 40.

After forming the variable resistance layer 30, as illustrated in FIGS. 14 and 15, the hole structure 72 is filled with the electrode 10. Thus, it is possible to form the electrode 10 in the second direction A2 (the direction perpendicular to the substrate 60) different from the first direction A1. As described above, the memory device 1 illustrated in FIGS. 1 to 3 is completed.

On the other hand, FIGS. 16 to 20 illustrate a method of manufacturing the memory device 101 according to the reference example. First, as illustrated in FIG. 16, on the substrate 160, the second electrode 150 and the interlayer insulating film 171 are stacked alternatively. By patterning and etching, the second electrode 150 is extended in the first direction A1 (the direction parallel to the substrate 160).

Next, as illustrated in FIG. 16 as well, a hole structure 172 is formed in the second direction A2 (the direction perpendicular to the substrate 160) different from the first direction A1, allowing the second electrode 150 to be exposed in an inner surface of the hole structure 172.

Subsequently, as illustrated in FIG. 17, the second electrode 150 exposed in the inner surface of the hole structure 172 is made to retreat by etching. Thus, a recess 173 is formed.

After this, as illustrated in FIG. 18, the ion source layer 120 is formed on the inner surface of the hole structure 172. Specifically, the ion source layer 120 is formed on the inner surface of the hole structure 172 by an ALD method or a CVD method, and then, an unnecessary portion except for a portion in the recess 173 is removed by etching.

Here, since the ion source layer 120 is configured of chalcogenide, deposition by an ALD method or a CVD method is difficult. Moreover, in a case of filling the ion source layer 120 in the recess 173, uniformity of the film deteriorates.

On the other hand, in the present embodiment, as illustrated in FIG. 7, on the substrate 60, the ion source layer 20 is extended in the first direction A1 (the direction parallel to the substrate 60), and the stacked structure is formed in which the ion source layer 20 and the interlayer insulating film 71 are stacked alternatively. Hence, it is possible to form the ion source layer 20 by sputtering, making it possible to attain high-speed, uniform film deposition.

After forming the ion source layer 120, as illustrated in FIG. 19, the variable resistance layer 130 is formed. Subsequently, as illustrated in FIG. 20, the hole structure 172 is filled with the second electrode 150. As described above, the memory device 101 according to the reference example illustrated in FIGS. 4 and 5 is completed.

The memory device 1 according to the present embodiment operates, for example, as follows.

In the memory device 1 according to the present embodiment, when a pulse voltage is applied to or a pulse current is supplied from an undepicted power source circuit (pulse application means) through the electrode 10 and the pad electrode 51 (the ion source layer 20), the storage layer 41 changes its electrical property (a resistance value), allowing information to be written, erased, or re-written. As an operation principle of such a resistance change memory, an ion conduction mechanism or an oxygen defect conduction mechanism are proposed. In the following, the operation will be concretely described.

First, a positive voltage is applied to the memory cell 40 in an initial state with high resistance, under conditions that, for example, the pad electrode 51 (the ion source layer 20) has a positive potential while the electrode 10 side has a negative potential. This allows the transition metal element in the ion source layer 20 to be ionized and travel toward the electrode 10 side, or allows an oxygen ion to travel from the electrode 10 side, causing occurrence of a cathode reaction on the electrode 10 side. This leads to occurrence of a reduction reaction in the variable resistance layer 30 formed at the interface with the electrode 10. In this way, there occurs a portion having an increased concentration of oxygen defects. The portions having a high concentration of oxygen defects, or the portions having a low degree of an oxidized state, are connected to one another to form a conduction path in the variable resistance layer 30. Thus, the variable resistance layer 30 exhibits a lower resistance value (a low resistance state) than that in the initial state (a high resistance state).

After this, even when the voltage applied to the memory cell 40 is eliminated by removing the positive voltage, the low resistance state is retained. Thus, information has been written. In an application to a memory device that enables only one-time writing, namely, a PROM (Programmable Read Only Memory), recording is completed only by the above-described recording process.

Meanwhile, an application to a memory device that enables erasing, namely, a RAM (Random Access Memory), an EEPROM (Electronically Erasable and Programmable Read Only Memory), or the like involves an erasing process. In the erasing process, a negative voltage is applied to the memory cell 40, under conditions that, for example, the pad electrode 51 (the ion source layer 20) has a negative potential while the electrode 10 side has a positive potential. This allows the transition metal ion to be oxidized and travel toward the ion source layer 20 side, resulting from an anode reaction in the conduction path in the portion having the high concentration of oxygen defects or in the portion having the low degree of the oxidized state that constitute the conduction path formed in the variable resistance layer 30. Alternatively, the oxygen ion travels from the ion source layer 20 to the vicinity of the conduction path in the variable resistance layer 30, which leads to reduction in the concentration of oxygen defects or a higher degree of the oxidized state. Thus, the conduction path is cut off, and the resistance value of the variable resistance layer 30 changes to the high resistance state from the low resistance state.

After this, even when the voltage applied to the memory cell 40 is eliminated by removing the negative voltage, the state in which the resistance value becomes high is retained. Thus, the written information has been erased. By repeating the above-described processes, writing of information in the memory cell 40 and erasing of the written information may be carried out repeatedly.

In the memory cell 40 as described above, for example, it is assumed that the states with the high resistance value and with the low resistance value correspond to information "0" and "1", respectively. Then, in the information recording process by applying a positive voltage, the information "0" is changed to "1." Likewise, in the information erasing process by applying a negative voltage, the information "1" is changed to "0." It is to be noted that, here, the operations of lowering and increasing the resistance of the memory cell correspond to the writing operation and the erasing operation, respectively. However, this correspondence relationship may be defined inversely.

FIGS. 21 to 23 schematically illustrate examples of the memory device 1 in the written state, the application of the erasing voltage, and the erased state, respectively. In the written state, the ion source layer 20 and the electrode 10 are connected through the conduction path P1 formed in the variable resistance layer 30, and the variable resistance layer 30 is in the low resistance state. In this example, the conduction path P1 has a shape protruding from the ion source layer 20 toward the variable resistance layer 30. In applying the erasing voltage, atoms contained in the conduction path P1 are ionized and return to the ion source layer 20 again. As a result, the conduction path P1 retreats toward the ion source layer 20. In the erased state, the conduction path P1 disappears, and the variable resistance layer 30 is in the high resistance state.

FIGS. 24 to 26 schematically illustrate other examples of the memory device 1 in the written state, the application of the erasing voltage, and the erased state, respectively. These examples are similar to the above-described examples except that a conduction path P2 has a shape protruding from the variable resistance layer 30 toward the ion source layer 20.

Furthermore, in the present embodiment, it is possible to control a so-called "writing resistance" and to allow for adjustment of the medium resistance value, by controlling the voltage in applying the bias voltage to the electrode 10 side in writing or by controlling a limit resistance or a gate voltage of a MOS transistor for driving. Moreover, also in the erasing operation, it is possible to control the medium resistance value, by adjusting magnitude of the bias voltage, the limit resistance, or a current value according to the gate voltage of the MOS transistor. In this way, not only a binary memory but also a multivalued memory may be attained.

For example, by adjusting the medium resistance value between the above-described two resistance values corresponding to "0" and "1", two levels may be newly added. This makes it possible to record four values, i.e., "00", "01", "10", and "11." In other words, it is possible to record 2 bits of information per one cell.

Specifically, in the memory cell 40 according to the present embodiment, as described above, the controllability and the retaining performance of the medium resistance values are improved by using the above-described transition metal element that is relatively stable in a layer containing a chalcogen element and oxygen as the ion source layer 20. Moreover, adjusting an amount of the oxygen and a composition ratio of the transition metal element to the chalcogen element in the ion source layer 20 allows for further improvement in the controllability and the retaining performance of the resistance values. Hereinafter, description will be given on a preferable amount of the oxygen and a preferable composition ratio of the transition metal element to the chalcogen element which are contained in the ion source layer 20.

As described above, the resistance value of the variable resistance layer 30 may be controlled with the states of the transition metal element in the vicinity of the conductive path, namely, the three states i.e., "the metal state/a tellurium compound state/the oxide state." The three states may be changed depending on the amount of the oxygen contained in the ion source layer 20, and it is possible to control the three states appropriately by adjusting the amount of the oxygen so as to be 10% to 55% both inclusive. When the amount of the oxygen in the ion source layer 20 is more than 55%, the contribution of the bonding of the transition metal element and the oxygen becomes too strong. This makes it difficult to take the three states i.e., "the metal state/the tellurium compound state/the oxide state", resulting in impossibility of maintaining the retaining performance of the medium resistance value. Meanwhile, when the amount of the oxygen in the ion source layer 20 is less than 10%, the medium composition and bonding state becomes difficult to be retained, which causes difficulties in retaining the medium resistance value. One plausible reason for this may be, though not clear, that the contribution of bonding of the transition metal element and the oxygen becomes weaker, which makes the bonding of the oxygen, the tellurium, and the transition metal element be likely to be imbalanced.

It is to be noted that the above-described phenomenon may apply to chalcogen elements other than tellurium, namely, sulfur and selenium having different electronegativity from that of oxygen. Moreover, as the chalcogen elements contained in the ion source layer 20, a combination of two or more of sulfur, selenium, and tellurium may be used. Furthermore, the above-described amount of the oxygen may be a value obtained by measuring the ion source layer 20 of the memory cell 40 using a Rutherford back scattering method (RBS).

The three states i.e., "the metal state/the tellurium compound state/the oxide state" may be also controlled by the composition ratio of the transition metal element to the chalcogen element which are contained in the ion source layer 20, in addition to the above-described amount of the oxygen in the ion source layer 20. Regarding a range of the compound ratio of the transition metal element to the chalcogen element which makes it possible to control the three states favorably, the amount of the transition metal element contained in the ion source layer 20 may fall within a range of 30% to 70% both inclusive (that is, the ratio of the transition metal element/the chalcogen element may be 3/7 to 7/3 both inclusive). When the amount of the transition metal element contained in the ion source layer 20 (the ratio of the transition metal element/the chalcogen element) is too small, the resistance value of the ion source layer 20 becomes too high, which causes difficulties in a device operation with a voltage generated by the MOS circuit. This tendency is prominent, in particular, in a fine device manufactured by an advanced process. When the amount of the transition metal element contained in the ion source layer 20 (the ratio of the transition metal element/the chalcogen element) is too large, the bonding of the oxygen, the tellurium, and the transition metal element tends to be imbalanced. Therefore, a phase change or a chemical change is likely to occur, making it difficult to retain the medium resistance.

Advantages of the present embodiment lie in the following (1) to (3).

(1) In a manufacturing process to form the storage layer 41 having a stacked structure inside the hole structure 72, it is possible to reduce the number of layers to be filled inside the hole structure 72.

More specifically, in the present embodiment, as illustrated in FIGS. 6 and 7, the stacked structure of the ion source layer 20 and the interlayer insulating film 71 is formed in advance. Therefore, it is not necessary to fill the ion source layer 20 inside the hole structure 72. It is only two layers, i.e., the variable resistance layer 30 and the electrode 10 that are to be filled therein. Filling of the ion source layer 20 becomes unnecessary. This makes it possible to ensure a sufficiently large diameter of the hole structure 72 in filling of the variable resistance layer 30 and the electrode 10. Hence, it is possible to form uniformly the variable resistance layer 30 and the electrode 10.

(2) In the present embodiment, as illustrated in FIGS. 6 and 7, the stacked structure of the ion source layer 20 and the interlayer insulating film 71 is formed in advance. Hence, it is possible to sufficiently thicken the ion source layer 20, attaining a resistance change memory having high reliability. In the following, more detailed description of this will be given.

A preliminary experiment was carried out regarding an influence of the thickness of the ion source layer 20 on memory characteristics. FIG. 27 illustrates a cross-sectional configuration of a testing device used in the preliminary experiment. The testing device 240 included a lower electrode 210 in a shape of a plug. The lower electrode 210 was surrounded by an insulating film 271 made of, for example, TEOS-SiO$_2$. On the insulating film 271, an interlayer insulating film 272 was provided. The interlayer insulating film 272 included an opening 272A having area S1 and had a thickness of 8 nm. On the interlayer insulating film 272, a variable resistance layer 230, an ion source layer 220, and an upper electrode 250 were stacked in the order named. The lower electrode 210 was configured of TiW, while the upper electrode 250 was configured of W. The area of the opening 272A was 400 nm$^2$.

FIG. 28 illustrates a measurement system of the preliminary experiment. The lower electrode 210 was connected to a terminal T3 side of a bit line BL through a selecting transistor Tr and a switch SW. The upper electrode 250 was connected to a terminal T5 side of a source line SL. A gate of the selecting transistor Tr was connected to a word line WL (a terminal T4). An ammeter A was connected in parallel to the switch SW. For the selecting transistor Tr, an NMOS having a size of W/L of 0.8 was used.

In the testing device 240, voltage waveforms illustrated in FIG. 29 were applied to the terminals T3, T4, T5 from the outside after the switch SW was closed. In this way, a current was allowed to flow in a direction from the lower electrode 210 to the upper electrode 250 in a writing cycle, and in a direction from the upper electrode 250 to the lower electrode 210 in an erasing cycle. In reading of data from the testing device 240, conductance of the device (a reciprocal of a resistance value) was measured using the ammeter A with the switch SW opened, based on a current flowing through the testing device 240 and the applied voltage (0.3 V in this case).

In the preliminary experiment, variation in set resistance was evaluated by (a standard variation: σ)/(a mean: μ)×100, while only the thickness of the ion source layer 220 was changed to 5 nm, 15 nm, 30 nm, and 45 nm. The number of bits evaluated was 60. Moreover, a set current was 20 μA, 25 μA, and 30 μA. FIG. 30 illustrates a result thus obtained. As seen from FIG. 30, when the thickness of the ion source layer 220 was reduced to 5 nm, the variation in set resistance rapidly increases. Accordingly, it is found that the thickness of the ion source layer 220 may be desirably at least 5 nm or larger, in order to obtain reliable memory characteristics.

Here, in the manufacturing process of the memory device 101 according to the reference example illustrated in FIGS. 18 to 20, as illustrated in FIG. 31, the ion source layer 120, the variable resistance layer 130, and the first electrode 110 are formed inside the hole structure 172. In order to form the ion source layer 120 having the thickness of at least 5 nm or larger, the hole structure 172 is filled with only the ion source layer 120 by at least 10 nm in diameter. As the hole structure 172 becomes narrower in diameter, it becomes more difficult to form a thin film with good coverage. It is therefore difficult to form uniformly the variable resistance layer 130 or the second electrode 150 inside the hole structure 172, causing deterioration in reliability or a yield. This disadvantage may become more remarkable, in a case of an increase in hierarchies of a three-dimensional memory for larger capacity, or in a case of further micro-miniaturization of a hole diameter of the hole structure 172. One possible method may be to form, before the ion source layer 120, the variable resistance layer 130 whose thickness is smaller. However, this method may involve the use of sophisticated technology anyway, in order to fill the two kinds of layers i.e., the ion source layer 120 and the first electrode 110 afterward.

FIG. 32 illustrates a relation between a technology node TN (the hole diameter of the hole structure 172. Refer to FIG. 31) and the variation in set resistance in the memory device 1 according to the present embodiment, in comparison with that of the memory device 101 according to the reference example. In the manufacturing process of the memory device 101 according to the reference example, the ion source layer 120 is formed inside the hole structure 172. Therefore, with an assumption that a thickness of the variable resistance layer 130 is, for example, 2.5 nm, the variation in set resistance increases as illustrated in FIG. 32 (here, it is assumed that, in FIG. 31, the ion source layer 120 fills all the portion other than the variable resistance layer 130 of the hole structure 172.) This is because a reduction in the technology node TN makes it impossible to ensure the thickness of the ion source layer 120.

On the other hand, in the present embodiment, as illustrated in FIG. 33, only the variable resistance layer 30 and the electrode 10 are formed inside the hole structure 72. Forming of the ion source layer 20 therein is unnecessary. Accordingly, as illustrated in FIG. 32, there is no influence by the thickness of the ion source layer 20 even in a case of a reduction in the technology node TN, and the variation in set resistance becomes constant. Hence, it is possible to attain a resistance change memory having high reliability.

(3) The ion source layer 20 is not filled in the hole structure 72. This allows for micro-miniaturization of the diameter of the hole structure 72, making it possible to fabricate the memory cells 40 in higher density than that of the memory device 101 according to the reference example.

More specifically, as seen from FIG. 30, the thickness of the ion source layer 20 is at least 5 nm. In a case of film formation over the entire surface of the hole structure 172 in FIG. 31, the hole structure 172 is occupied by the variable resistance layer 130 (having the thickness of 5 nm) and the ion source layer 120 (having the thickness of 10 nm). Accordingly, the technology node TN reaches the limit of allowance for fabrication with 15 nm. In other words, it is difficult to form the first electrode 110. On the other hand, in the present embodiment, it is not necessary to consider the thickness of the ion source layer 20, making it possible to micro-miniaturize the technology node TN to 5 nm. Hence, it is possible to enhance storage capacity per unit area.

It is to be noted that the thickness of the variable resistance layer 130 is assumed to be 2.5 nm in the forgoing description of FIG. 32, but this is not limitative. Moreover, the formation of the electrode and its resistivity are not considered.

As described above, in the present embodiment, the ion source layer 20 is extended in the first direction A1 and is shared by the plurality of memory cells 40 arranged in the first direction A1. The electrode 10 is extended in the second direction A2 and is shared by the plurality of memory cells 40 arranged in the second direction A2. The second direction A2 is different from the first direction A1. Hence, it is possible to attain micro-miniaturization in the third direction A3 perpendicular to both the first direction A1 and the second direction A2 (the direction in which the ion source layer 20 and the electrode 10 face each other with the variable resistance layer 30 in between).

Moreover, it becomes easier to ensure the thickness of the ion source layer 20. This makes it possible to reduce the variation in set resistance, leading to enhanced reliability.

Furthermore, it becomes unnecessary to fill the ion source layer 20 in the hole structure 72, making it possible to form the ion source layer 20 by a sputtering method. Hence, it is possible to gain advantages such as improvement in deposition speed, good coverage, and uniformization of film quality.

In addition, it becomes unnecessary to fill the ion source layer 20 in the hole structure 72, making it possible to reduce a recession width R73 (refer to FIG. 11) of the recess 73. Hence, it is possible to reduce a width L (refer to FIG. 11) of the stacked structure. This allows for further micro-miniaturization. Moreover, it is also possible to reduce a diameter R72 (refer to FIG. 11) of the hole structure 72, contributing to higher density.

Second Embodiment

FIGS. 34 to 43 illustrate a method of manufacturing a memory device according to a second embodiment of the present disclosure in the order of procedure. In the manufacturing method of the above-described first embodiment, description has been given on a case in which the separation groove 76 is filled with the separation insulating film 77. The manufacturing method according to the present embodiment is different from that of the above-described first embodiment in that, after the separation groove 76 is filled with the variable resistance layer 30 and the electrode 10, the hole structure 72 is formed in the variable resistance layer 30 and the electrode 10, and then, the hole structure 72 is filled with the separation insulating film 77.

First, as illustrated in FIG. 34, in a similar manner to the first embodiment, the ion source layer 20 and the interlayer insulating film 71 are stacked alternatively on the substrate 60.

Next, as illustrated in FIGS. 35 and 36, in a similar manner to the first embodiment, by patterning and etching, the ion source layer 20 and the interlayer insulating film 71 are extended in the first direction A1 (the direction parallel to the substrate 60). The ion source layer 20 is patterned in a shape of a plurality of parallel lines extending in the first direction A1. The adjacent ion source layers 20 are separated from one another by the separation groove 76.

Subsequently, as illustrated in FIG. 37, the ion source layer 20 exposed in an inner surface of the separation groove 76 is made to retreat by etching. Thus, the recess 73 is formed.

After this, as illustrated in FIG. 38, on the inner surface of the separation groove 76, the variable resistance material layer 30A is formed by, for example, an ALD method or a CVD method. The variable resistance material layer 30A may be deposited continuously over the entire surface of the separation groove 76 and the recess 73.

After forming the variable resistance material layer 30A on the inner surface of the separation groove 76, as illustrated in FIG. 39, for example, with use of anisotropic etching (reactive ion etching), an unnecessary portion of the variable resistance material layer 30A is removed. Thus, the variable resistance layer 30 is formed in the recess 73.

It is to be noted that the variable resistance layer 30 is configured of a high resistance material. Therefore, the continuity of the variable resistance layer 30 between the adjacent memory cells 40 is very unlikely to affect the adjacent memory cells 40.

After forming the variable resistance layer 30, as illustrated in FIGS. 40 and 41, the separation groove 76 is filled with the electrode 10. Thus, it is possible to form the electrode 10 in the second direction A2 (the direction perpendicular to the substrate 60) different from the first direction A1.

After this, as illustrated in FIG. 42, the electrode 10 is provided with the hole structure 72 in the second direction A2 (the direction perpendicular to the substrate 60) different from the first direction A1.

It is to be noted that, here, the hole structure 72 is formed in a shape of a square pillar, however, this is not limitative. Instead, the hole structure 72 may have various shapes such as a columnar shape or an elliptic cylindrical shape.

Subsequently, as illustrated in FIG. 43, the hole structure 72 is filled with the separation insulating film 77 by, for example, an ALD method or a CVD method. Thus, the electrode 10 is formed in a shape extended in the second direction A2 (the direction perpendicular to the substrate 60). The adjacent electrodes 10 are separated from one another by the separation insulating film 77. As described above, the memory device 1 illustrated in FIGS. 1 to 3 is completed.

As described above, in the present embodiment, the separation groove 76 is filled with the variable resistance layer 30 and the electrode 10. Since the separation groove 76 is wider than the hole structure 72, it is possible to form the storage layer 41 having higher quality, as compared with the case in which the variable resistance layer 30 and the electrode 10 are formed in the hole structure 72. In particular, the present embodiment may be suitable for a case in which the diameter of the hole structure 72 is minute.

It is to be noted that the manufacturing method according to the present embodiment may be applicable to modification examples 1 to 6, a third embodiment, or a fourth embodiment, which will be described below.

Modification Example 1

FIG. 44 illustrates a configuration of a memory device 1A according to a modification example 1. The present modification example has a similar configuration to that of the above-described first embodiment except that both the ion source layer 20 and the electrode 10 are extended in a horizontal plane (a plane parallel to the substrate 60).

In the present modification example, it is possible to omit the formation of the electrode 10 in the hole structure 72, which affords advantages such as reduction in the number of manufacturing processes, and scaling in the direction perpendicular to the substrate 60 (the A3 direction).

Modification Example 2

FIG. 45 illustrates a configuration of a memory device 1B according to a modification example 2. The present modification example is similar to the above-described first embodiment except that the variable resistance layer 30 is provided on one side of the electrode 10.

Modification Example 3

FIG. 46 illustrates a configuration of a memory device 1C according to a modification example 3. The present modification example involves replacement of positions of the electrode 10 and the ion source layer 20, where the ion source layer 20 is extended perpendicularly to the substrate 60 while the electrode 10 is extended in parallel with the substrate 60. Moreover, similarly to the modification example 2, the variable resistance layer 30 is provided on one side of the electrode 10. Otherwise, the memory device 1C has similar configuration, operation, and effects to those of the above-described first embodiment.

Modification Example 4

FIG. 47 illustrates a configuration of a memory device 1D according to a modification example 4. As illustrated in FIG. 47, it is not necessary that the positions of the variable resistance layers 30 are aligned in the same direction with respect to the electrode 10 in a plurality of hierarchies. The variable resistance layer 30 may be in contact with any portion (side surface) of the electrode 10. Moreover, the variable resistance layer 30 may be in contact with a plurality of portions (side surfaces) of the electrode 10. Furthermore, it is not necessary that the directions in which the ion source layers 20 are extended are unified in the whole memory device 1D.

Modification Example 5

FIG. 48 illustrates a configuration of a memory device 1E according to a modification example 5. As illustrated in FIG. 48, part of the plurality of ion source layers 20 may be connected by a connecting section 20C. Moreover, there is no limitation on a connecting configuration (for example, positions or the number of the connecting sections 20C). The plurality of ion source layers 20 may be connected in a combination suitable for positions or operations that facilitate connection to a peripheral circuit.

Modification Example 6

FIG. 49 illustrates a configuration of a memory device 1F according to a modification example 6. As illustrated in FIG. 49, the ion source layer 20 and the electrode 10 may be extended to intersect at an angle different from a right angle.

It is possible to make a combination of two, three or more of the above-described modification examples 1 to 6. Moreover, it is possible to make a combination of one or more of the above-described modification examples 1 to 6 and the following third or fourth embodiment.

Third Embodiment

FIG. 50 illustrates a basic configuration of a memory device 1G according to a third embodiment of the present disclosure. The memory device 1G involves a backing electrode layer 90 in contact with the second surface 20B of the ion source layer 20 in consideration of a case in which the ion source layer 20 becomes longer and has higher resistance. Otherwise, the memory device 1G has a similar configuration to that of the above-described first embodiment.

The backing electrode layer 90 may be provided in contact with the second surface 20B of the ion source layer 20, as described above. The second surface 20B of the ion source layer 20 refers to a surface opposed to the first layer 20A that is in contact with the variable resistance layer 30. There is no limitation on a material of the backing electrode layer 90. Examples may include a monolayer or stacked layer structure including tungsten (W), tungsten nitride (WN), copper (Cu), aluminum (Al), molybdenum (Mo), tantalum (Ta), titanium nitride (TiN), tantalum nitride (TaN), silicide, and so forth.

FIGS. 51 to 57 illustrate a main part of a method of manufacturing the memory device 1G in the order of procedure. It is to be noted that the same processes as those of the manufacturing method of the first embodiment will be described with reference to FIGS. 6 to 8.

First, in a similar manner to the first embodiment, by the processes illustrated in FIGS. 6 and 7, the ion source layer 20 and the interlayer insulating film 71 are stacked alternatively on the substrate 60, and extended, by patterning and etching, in the first direction A1 (the direction parallel to the substrate 60). The ion source layer 20 is patterned into in a shape of a plurality of parallel lines extending in the first direction A1. The adjacent ion source layers 20 are separated from one another by the separation groove 76.

Next, in a similar manner to the first embodiment, by the process illustrated in FIG. 8, the separation groove 76 is filled with the separation insulating film 77.

After this, as illustrated in FIG. 51, the separation insulating film 77 is provided with the hole structure 72 in the second direction A2 (the direction perpendicular to the substrate 60) different from the first direction A1, allowing the ion source layer 20 to be exposed in the inner surface of the hole structure 72.

Subsequently, as illustrated in FIG. 52, the ion source layer 20 exposed in the inner surface of the hole structure 72 is made to retreat by etching. Thus, the recess 73 is formed.

After this, as illustrated in FIG. 53, in a similar manner to the first embodiment, the variable resistance layer 30 is formed in the recess 73.

After forming the variable resistance layer 30, as illustrated in FIG. 54, the hole structure is filled with the electrode 10. This makes it possible to form the electrode 10 in the second direction A2 (the direction perpendicular to the substrate 60) different from the first direction A1.

After forming the electrode 10, as illustrated in FIG. 55, a groove structure 74 is formed in a shape of a line along the ion source layer 20 at an intermediate position between the adjacent electrodes 10, allowing the ion source layer 20 to be exposed in an inner surface of the groove structure 74.

Subsequently, as illustrated in FIG. 56, the ion source layer 20 exposed in the inner surface of the groove structure 74 is made to retreat by etching. Thus, a recess 75 is formed.

After this, a backing electrode material layer (not illustrated) is formed on the inner surface of the groove structure 74 and an inner surface of the recess 75. An unnecessary portion of the backing electrode material layer is removed by etching (reactive ion etching). In this way, as illustrated in FIG. 57, the backing electrode layer 90 is formed in contact with the second surface 20B of the ion source layer 20. After this, a gap of the groove structure 74 may be filled with an insulating film. As described above, the memory device 1G illustrated in FIG. 50 is completed.

It is to be noted that, in the forgoing manufacturing method, description has been given on a case in which the backing electrode layer 90 is collectively formed with respect to the ion source layer 20 over a plurality of hierarchies in the second direction A2. However, it is possible to form the backing electrode layer 90 for each hierarchy in the process illustrated in FIG. 51 in which the ion source layer 20 and the interlayer insulating film 71 are stacked alternatively to form the stacked structure. In the manufacturing method as described above, the backing electrode layer 90 is collectively formed with respect to the ion source layer 20 over the plurality of hierarchies, which makes it possible to reduce the number of lithography processes and is suitable, in particular, for a case with increased hierarchies.

The memory device 1G operates similarly to the first embodiment.

As described above, in the present embodiment, the backing electrode layer 90 is formed in contact with the second surface 20B of the ion source layer 20. Hence, it is possible to restrain an increase in resistance in a case in which the ion source layer 20 is lengthened.

Fourth Embodiment

Next, description will be given on a memory device according to a fourth embodiment of the present disclosure. In the memory device, the variable resistance layer 30 is allowed to have a function of a diode by including a specific material, or the like. By allowing the variable resistance layer 30 to have a function of a diode, it is possible to prevent a cross talk, to improve reproducibility of resistance change characteristics, and to obtain high reliability, while flowing a sufficient current in reading or in writing. Otherwise, the memory device may have a similar configuration to that of the above-described first embodiment.

For example, preferably, the variable resistance layer 30 may have a layer structure configured of an oxide or a nitride including a metallic or a semimetal element having a non-linear characteristic. The layer structure may be monolayer or stacked. In this way, the variable resistance layer 30 may have a function of a diode that is configured to restrict a current in accordance with a voltage level.

Specifically, the variable resistance layer 30 may have functions of both memory switching and threshold switching by including NbOx.

Alternatively, the variable resistance layer 30 may have a function of a bidirectional diode by including a multi-layered structure of TaOx and TiO. This allows for an operation suitable for a resistance change memory.

Moreover, the variable resistance layer 30 may have a function of a diode by including a chalcogen element and being configured of an OTS (Ovonic Threshold Switch).

In another alternative, the variable resistance layer 30 may be connected in series to a non-linear element that is configured of a pn junction diode, MIS (metal/insulator/semiconductor) diode, MIM (metal/insulator/metal) diode, MSM (metal/semiconductor/metal) diode, or a varistor.

Although description has been made by giving the example embodiments, the contents of the present disclosure are not limited to the above-mentioned example embodiments and may be modified in a variety of ways. For example, in the above-described example embodiments, description has been given on a case in which the storage layer 41 includes the ion source layer 20 and the variable resistance layer 30. However, in the present disclosure, the plurality of layers that constitute the storage layer 41 are not limited to the combination of the ion source layer 20 and the variable resistance layer 30. The present disclosure may be widely applicable to any memory device with the storage layer 41 including the plurality of layers, without limitation on a configuration or an operation method.

Moreover, for example, in the above-described example embodiments, description has been given on a case in which the storage layer 41 has a two-layer structure of the ion source layer 20 and the variable resistance layer 30. However, the present disclosure is not limited thereto, and may be applied to a case in which the storage layer 41 is configured of three or more layers.

Furthermore, for example, in the above-described example embodiments, a sectional shape of the electrode 10 is not limited to a rectangular or circular shape, but may be other shapes such as an ellipse. Likewise, a sectional shape of the ion source layer 20 is not limited to a rectangular shape, but may be other shapes such as a circle or an ellipse.

In addition, for example, a material, or a deposition method or a deposition condition of each layer as described in the above-mentioned example embodiment are not limitative, but other materials, or other deposition methods or other deposition conditions may be adopted. For example, in the first embodiment, other transition metal element may be added to the ion source layer 20. Examples may included titanium (Ti), hafnium (Hf), vanadium (V), niobium (Nb), tantalum (Ta), chromium (Cr), molybdenum (Mo), tungsten (W). Moreover, nickel (Ni) may be also added, as well as copper (Cu), silver (Ag), or zinc (Zn).

Furthermore, in the above-described example embodiments, description has been given on a case in which the substrate 60 is a silicon substrate. However, the substrate 60 may be a glass substrate on which a polysilicon or metal film is formed, or a quartz substrate.

In addition, for example, in the above-described example embodiments, description has been given on specific configurations of the memory cell 40 and the memory devices 1, 1A to 1H. However, it is not necessary to include all the layers, and another layer or other layers may be further provided.

Furthermore, for example, in the above-described example embodiments, description has been given on a case in which the variable resistance layer 30 and the electrode 10 are formed in the hole structure 72. However, other additional structures may be formed in the hole structure 72. Specific examples may include a diode, a junction layer, or a silicide layer. However, in this case, in view of an operation principle, it is preferable that the ion source layer 20 be in contact with the variable resistance layer 30. Therefore, after forming the recess 73 by making the ion source layer 20 to retreat by etching, it is preferable that the variable resistance layer 30 be formed first. Moreover, in the modification example 3, after making the electrode 10 to retreat by etching, it is preferable that the diode, the junction layer, the silicide layer, or the like be formed, and then, the variable resistance layer 30 and the ion source layer 20 be formed continuously.

It is to be noted that the contents of the present technology may have the following configurations.

(1)
A memory device including a plurality of memory cells that each include an electrode and a storage layer, the storage layer being configured of a plurality of layers,
wherein one layer of the plurality of layers is extended in a first direction and is shared by the plurality of memory cells arranged in the first direction, and
the electrode is extended in a second direction and is shared by the plurality of memory cells arranged in the second direction, the second direction being different from the first direction.

(2)
The memory device according to (1),
wherein one or more remaining layers of the plurality of layers are provided between the electrode and the one layer of the plurality of layers.

(3)
The memory device according to (2),
wherein the one layer is an ion source layer, and the one or more remaining layers are a variable resistance layer.

(4)
The memory device according to any one of (1) to (3), further including a substrate,
wherein the electrode is extended in a direction parallel to the substrate.

(5)
The memory device according to any one of (1) to (3), further including a substrate,
wherein the electrode is extended in a direction perpendicular to the substrate.

(6)
The memory device according to any one of (1) to (5),
wherein the ion source layer and the electrode intersect perpendicularly with each other.

(7)
The memory device according to any one of (3) to (6),
wherein the ion source layer is provided in a plurality, the electrode is provided in a plurality, and
the plurality of memory cells are disposed at intersections of the plurality of ion source layers and the plurality of electrodes.

(8)
The memory device according to any one of (3) to (7),
wherein the ion source layer is shared by the plurality of memory cells that are adjacent to one another in a third direction perpendicular to both the first direction and the second direction.

(9)
The memory device according to any one of (3) to (8),
wherein the ion source layer has a function as an opposing electrode with respect to the electrode.

(10)
The memory device according to any one of (3) to (9),
wherein the ion source layer includes a first surface and a second surface, the first surface being in contact with the variable resistance layer, and the second surface being opposed to the first surface, and
a backing layer is provided in contact with the second surface.

(11)
The memory device according to any one of (3) to (10),
wherein the ion source layer includes a chalcogen element {S, Se, Te}, oxygen, and at least one transition metal element, and
the at least one transition metal element is selected from Group 4 titanium group {Ti, Zr, Hf}, Group 5 vanadium group {V, Nb, Ta}, and Group 6 chromium group {Cr, Mo, W}.

(12)
The memory device according to any one of (3) to (11),
wherein the variable resistance layer is configured of an oxide film, a nitride film, or an oxynitride film of a metal element.

(13)
The memory device according to (11) or (12),
wherein application of a voltage to the electrode and the ion source layer allows a low resistance portion to be formed in the variable resistance layer to cause a change in a resistance value, the low resistance portion including the transition metal element or including an oxygen defect.

(14)
The memory device according to any one of (3) to (13),
wherein the variable resistance layer has a monolayer or stacked layer structure configured of an oxide or a nitride including a metallic or semimetal element having a non-linear characteristic.

(15)
The memory device according to any one of (3) to (13),
wherein the variable resistance layer includes a chalcogen element and is configured of an ovonic threshold switch.

(16)
The memory device according to any one of (3) to (13),
wherein the variable resistance layer is connected in series to a non-linear element.

(17)
A method of manufacturing a memory device, the memory device including a plurality of memory cells that each include an electrode and a storage layer, the storage layer being configured of a plurality of layers, the method including:
forming, on a substrate, one layer of the plurality of layers to extend in a first direction,
forming a separation insulating film in a separation groove in the one layer,
forming, in the separation insulating film, a hole structure in a second direction, allowing the one layer to be exposed in an inner surface of the hole structure, the second direction being different from the first direction,
forming one or more remaining layers of the plurality of layers on the inner surface of the hole structure, and
filling the hole structure with the electrode.

(18)
The method of manufacturing the memory device according to (17),
wherein, after the one layer exposed in the inner surface of the hole structure is made to retreat by etching, the one or more remaining layers are formed on the inner surface of the hole structure.

(19)

The method of manufacturing the memory device according to (17) or (18), wherein, in the forming of the one layer, the one layer and an interlayer insulating layer are stacked alternatively on the substrate.

(20)

The method of manufacturing the memory device according to any one of (17) to (19), wherein an ion source layer is formed as the one layer, and a variable resistance layer is formed as the one or more remaining layers.

(21)

The method of manufacturing the memory device according to (20), wherein the ion source layer is formed in the first direction parallel to the substrate, and the hole structure and the electrode are provided in the second direction perpendicular to the substrate.

(22)

The method of manufacturing the memory device according to (20) or (21), wherein the ion source layer includes a first surface and a second surface, the first surface being in contact with the variable resistance layer, and the second surface being opposed to the first surface, the method including:

forming, in the ion source layer, a groove structure in the second direction, allowing the second surface of the ion source layer to be exposed in an inner surface of the groove structure, after forming the electrode; and forming a backing electrode layer in contact with the second surface of the ion source layer.

(23)

The method of manufacturing the memory device according to (22), wherein the backing electrode layer is formed after the ion source layer exposed in the inner surface of the groove structure is made to retreat by etching.

(24)

A method of manufacturing a memory device, the memory device including a plurality of memory cells that each include an electrode and a storage layer, the storage layer being configured of a plurality of layers, the method including:

forming, on a substrate, one layer of the plurality of layers to extend in a first direction, forming one or more remaining layers of the plurality of layers and the electrode in a separation groove in the one layer, forming, in the electrode, a hole structure in a second direction, the second direction being different from the first direction, and filling the hole structure with a separation insulating film.

(25)

The method of manufacturing the memory device according to (24), wherein, in the forming of the one layer, the one layer and an interlayer insulating layer are stacked alternatively on the substrate.

(26)

The method of manufacturing the memory device according to (24) or (25), wherein an ion source layer is formed as the one layer, and a variable resistance layer is formed as the one or more remaining layers.

(27)

The method of manufacturing the memory device according to (26), wherein the ion source layer is formed to extend in the first direction parallel to the substrate, and the hole structure and the separation insulating film is formed in the second direction perpendicular to the substrate.

(28)

The method of manufacturing the memory device according to (26) or (27), wherein the ion source layer includes a first surface and a second surface, the first surface being in contact with the variable resistance layer, and the second surface being opposed to the first surface, the method including:

forming, in the ion source layer, a groove structure in the second direction, allowing the second surface of the ion source layer to be exposed in an inner surface of the groove structure, after forming the electrode; and forming a backing electrode layer in contact with the second surface of the ion source layer.

(29)

The method of manufacturing the memory device according to (28), wherein the backing electrode layer is formed after the ion source layer exposed in the inner surface of the groove structure is made to retreat by etching.

This application claims the benefit of Japanese Priority Patent Application JP 2012-282108 filed on Dec. 26, 2012, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A memory device comprising:
a layer of conductive material, strips of the layer extend linearly in parallel along a first direction;
electrodes that extend from a substrate linearly in parallel along a second direction, the second direction is perpendicular to the first direction;
variable resistance material, a first portion of the variable resistance material is between a first one of the strips and a first one of the electrodes and a second portion of the variable resistance material is between the first one of the strips and a second one of the electrodes; and
an interlayer insulating layer between the layer and the substrate, the substrate is perpendicular to the second direction,
wherein the substrate includes a semiconductor material, the substrate touches the electrodes, and
wherein the conductive material includes a chalcogen element {S, Se, Te}, oxygen, and at least one transition metal element.

2. The memory device according to claim 1, wherein the substrate is a silicon substrate.

3. The memory device according to claim 1, wherein a CMOS circuit is on the substrate.

4. The memory device according to claim 1, wherein the interlayer insulating layer is between one of the electrodes and another of the electrodes.

5. The memory device according to claim 1, wherein the layer is an ion source layer.

6. The memory device according to claim 1, wherein the transition metal element is a material from Group 4 titanium group{Ti, Zr, Hf}.

7. The memory device according to claim 1, wherein the transition metal element is a material from Group 5 vanadium group{V, Nb, Ta}.

8. The memory device according to claim 1, wherein the transition metal element is a material from Group 6 chromium group{Cr, Mo, W}.

9. The memory device according to claim 1, wherein the variable resistance material is configured of an oxide film, a nitride film, or an oxynitride film of a metal element.

10. The memory device according to claim 1, wherein the variable resistance material is connected in series to a non-linear element.

11. The memory device according to claim 10, wherein the non-linear element is configured of a pn junction diode, a metal/insulator/semiconductor diode, a metal/insulator/metal diode, a metal/semiconductor/metal diode, or a varistor.

12. The memory device according to claim 1, wherein a first portion of the variable resistance material is between the first one of the strips and the first one of the electrodes.

13. The memory device according to claim 12, wherein the layer is between the interlayer insulating layer and a different interlayer insulating layer, the interlayer insulating layer and the different interlayer insulating layer physically touch the first portion of the variable resistance material.

14. The memory device according to claim 12, wherein the first one of the electrodes and the first one of the strips physically touch the first portion of the variable resistance material.

15. The memory device according to claim 12, wherein a second portion of the variable resistance material is between the first one of the strips and a second one of the electrodes.

16. The memory device according to claim 15, wherein the first one of the electrodes and the second one of the electrodes are of a same material.

17. The memory device according to claim 15, wherein the first one of the strips and the second one of the electrodes physically touch the second portion of the variable resistance material.

18. The memory device according to claim 15, wherein a third portion of the variable resistance material is between the second one of the electrodes and a third one of the strips.

19. The memory device according to claim 18, wherein the second one of the electrodes and the third one of the strips physically touch the third portion of the variable resistance material.

* * * * *